United States Patent [19]
Wada et al.

[11] Patent Number: 5,687,111
[45] Date of Patent: Nov. 11, 1997

[54] STATIC TYPE SEMICONDUCTOR MEMORY DEVICE CAPABLE OF OPERATING AT A LOW VOLTAGE AND REDUCING A MEMORY CELL AREA

[75] Inventors: Tomohisa Wada; Kunihiko Kozaru; Toru Shiomi, all of Hyogo, Japan

[73] Assignee: Mitsubishi Denki Kabushiki Kaisha, Tokyo, Japan

[21] Appl. No.: 609,313

[22] Filed: Mar. 1, 1996

[30] Foreign Application Priority Data

Jul. 14, 1995 [JP] Japan ................................ 7-178880

[51] Int. Cl.⁶ .................... G11C 11/00; H01L 27/02
[52] U.S. Cl. .................... 365/154; 365/174; 365/177; 365/182; 257/378; 257/903
[58] Field of Search .................... 365/154, 174, 365/177, 182; 257/903, 378

[56] References Cited

U.S. PATENT DOCUMENTS

| | | | |
|---|---|---|---|
| 3,986,173 | 10/1976 | Baitinger et al. | 365/154 |
| 4,661,831 | 4/1987 | Schmitt-Landsiedel et al. | 365/154 |
| 5,404,030 | 4/1995 | Kim et al. | 257/903 |
| 5,453,636 | 9/1995 | Eitan et al. | 365/154 |

FOREIGN PATENT DOCUMENTS

| | | |
|---|---|---|
| 62-254463 | 11/1987 | Japan. |
| 2-237151 | 9/1990 | Japan. |
| 3-83293 | 4/1991 | Japan. |
| 3-234059 | 10/1991 | Japan. |

OTHER PUBLICATIONS

"A 34ns 1–Mbit CMOS SRAM Using Triple Polysilicon" by Tomohisa WADA et al., *IEEE*, 1987.

"A 9–ns 1 Mbit CMOS SRAM" by Katsuro Sasaki et al., *IEEE*, 1989.

*Primary Examiner*—Son T. Dinh
*Attorney, Agent, or Firm*—Lowe, Price, LeBlanc & Becker

[57] ABSTRACT

A pair of driving bipolar transistors of a lateral type T1 and T2 have emitters coupled to a ground potential, collectors connected to a pair of highly resistive elements R1 and R2. Highly resistive elements R1 and R2 have respective other ends coupled to power supply potential $V_{CC}$, and bases and collectors of transistors T1 and T2 are cross-connected to each other, thereby forming a flipflop circuit. Access MOS transistors Q3 and Q4 having a gate potential controlled by word line WL are each connected to form a conduction path between one of storage nodes A and B and one of the pair of bit lines BL and /BL.

6 Claims, 22 Drawing Sheets

FIG. 1
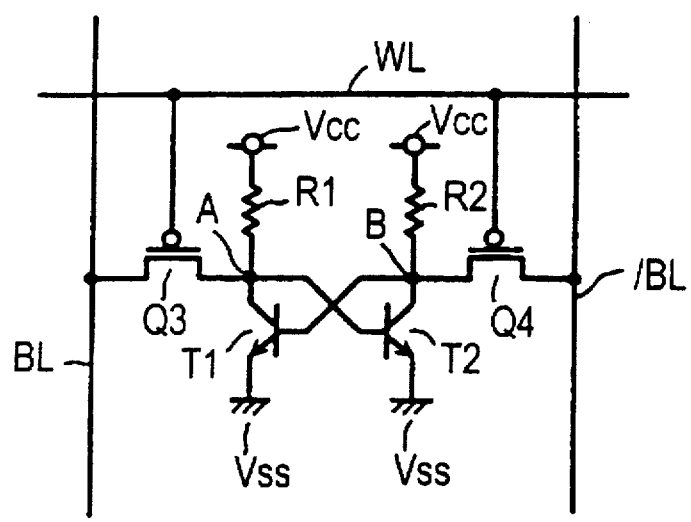
FIG. 2(a)    FIG. 2(b)
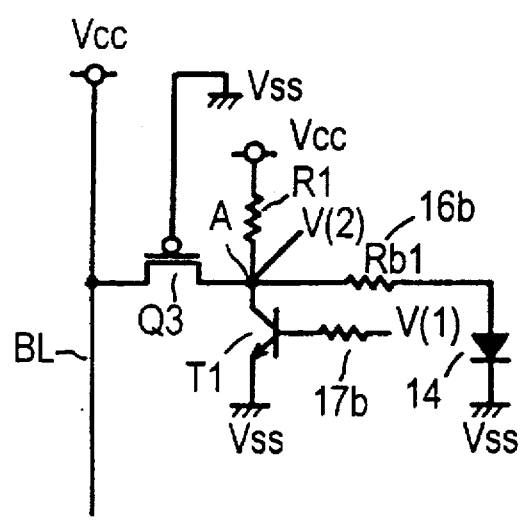 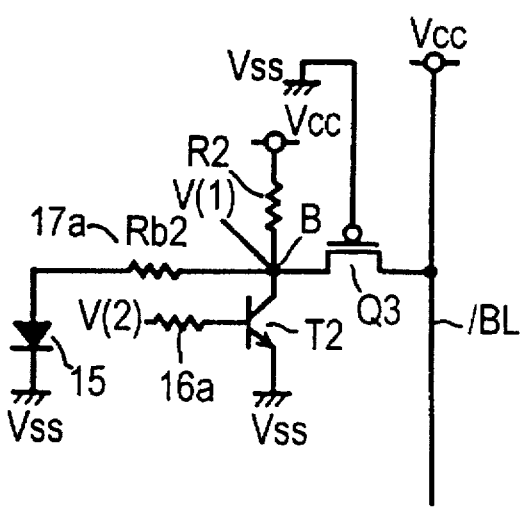

FIG. 10(d)
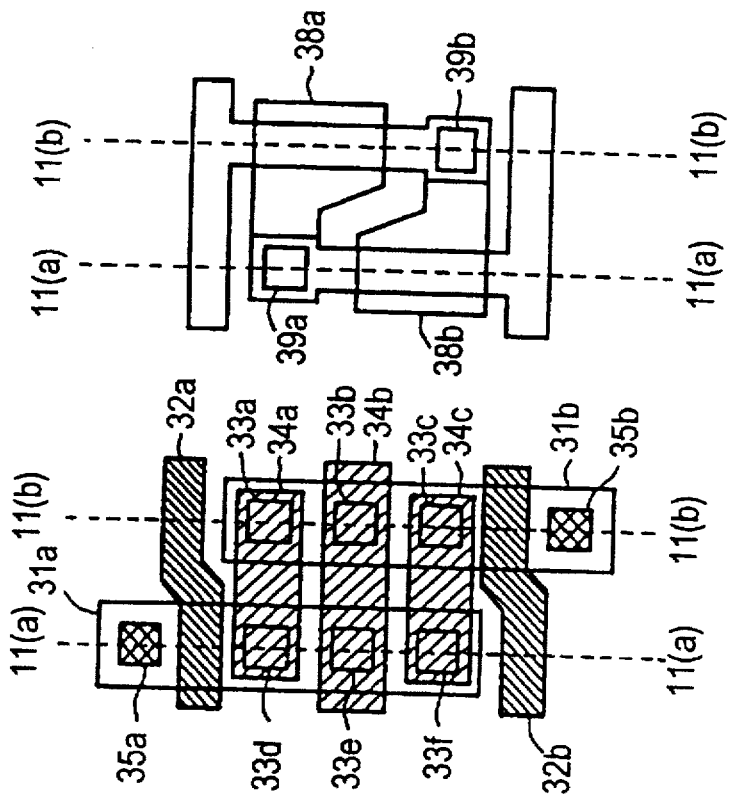
FIG. 10(c)
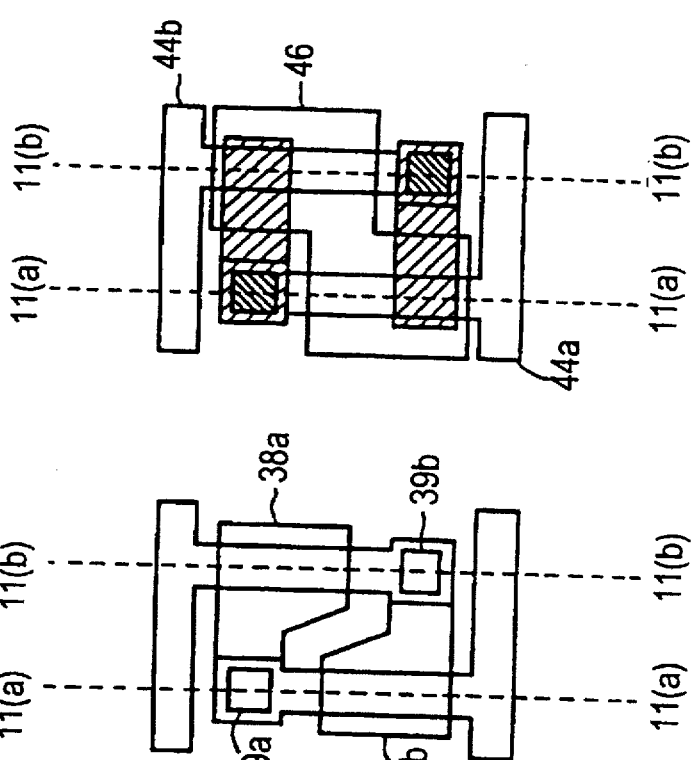
FIG. 10(b)
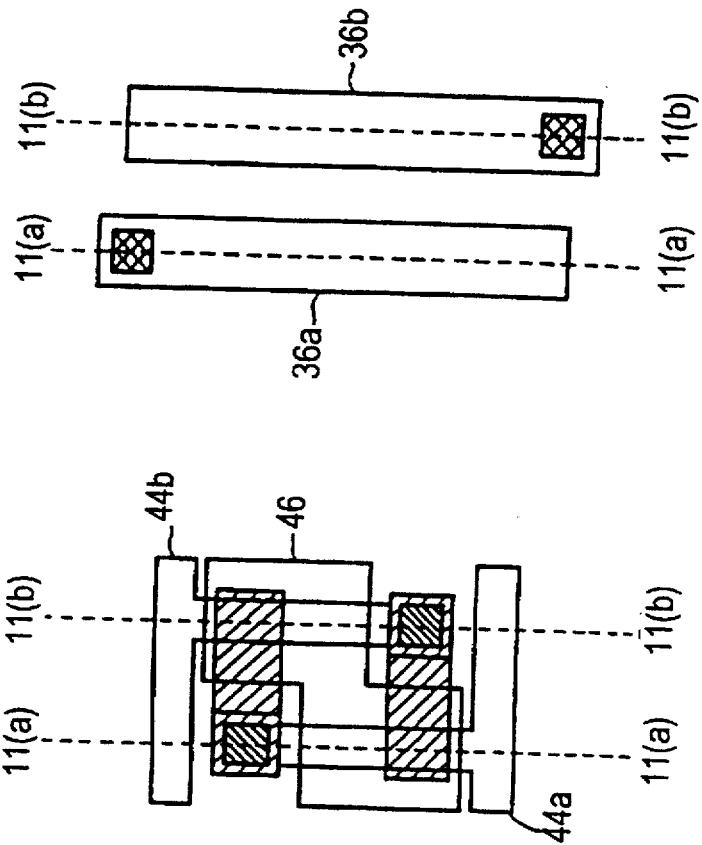
FIG. 10(a)

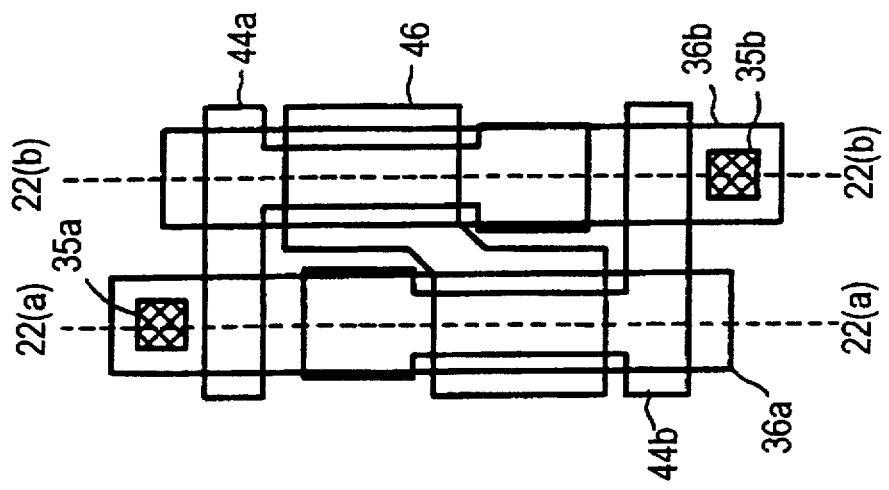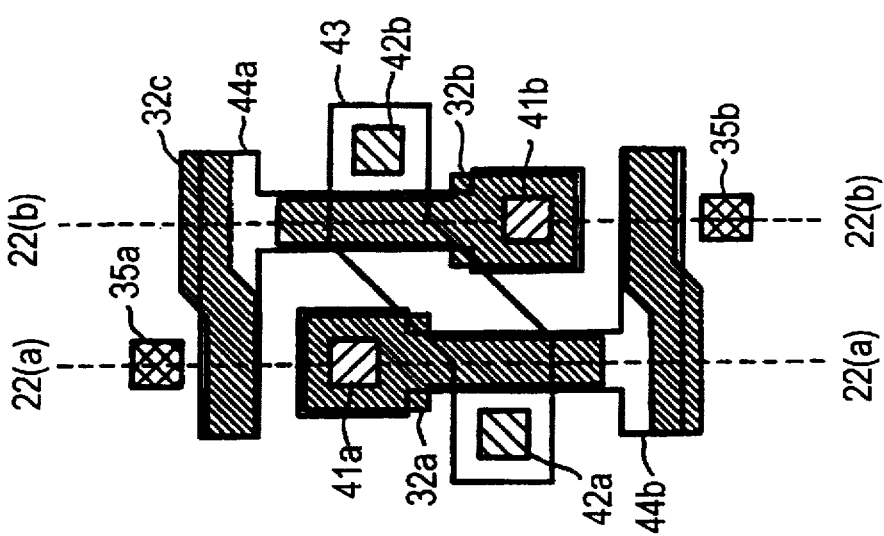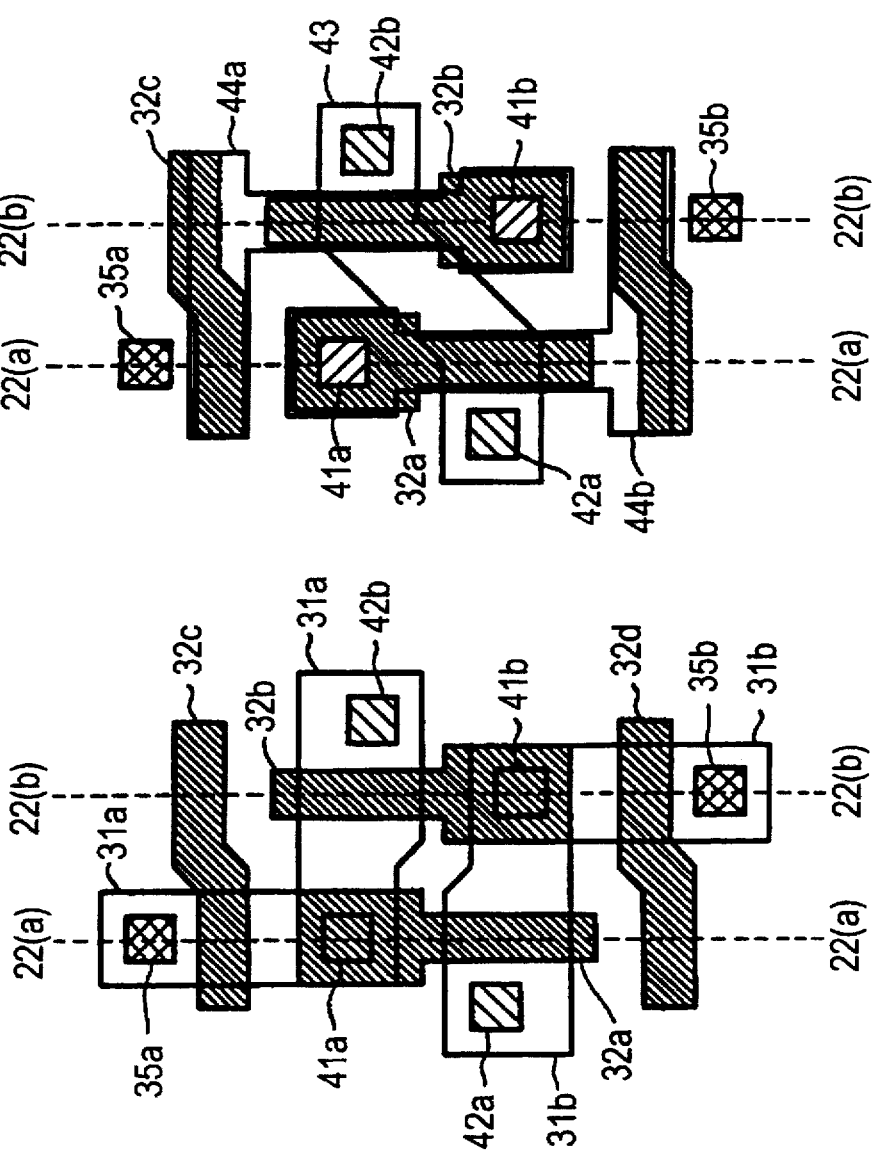

STATIC TYPE SEMICONDUCTOR MEMORY DEVICE CAPABLE OF OPERATING AT A LOW VOLTAGE AND REDUCING A MEMORY CELL AREA

BACKGROUND OF THE INVENTION

1. Field of the Invention

The present invention relates to semiconductor memory devices, and more particularly, to circuit arrangement and structure of a static type RAM capable of operating at a low voltage.

2. Description of the Background Art

In a static type RAM, a memory cell is formed by a flipflop circuit and an access transistor. As the structure of such a memory cell, a highly resistive load type and a CMOS type are known. The highly resistive load cell is advantageous in enhancing integration level since a resistor can be stacked on a transistor, but has a disadvantage that it lacks stability in holding data. The CMOS type cell excels in stability in holding data as compared with the highly resistive load type cell, but has a disadvantage that greater area is occupied on a substrate. Thus, a technique for forming a cell by using a TFT (Thin Film Transistor) as a load is implemented in order to utilize the characteristics of the CMOS type cell and maintain the high integration level.

FIG. 19 is an equivalent circuit diagram of a memory cell in a conventional static type semiconductor memory device of a highly resistive load type.

N type MOSFETs Q1 and Q2 and highly resistive elements R1 and R2 are connected respectively in series between a power supply potential $V_{CC}$ and a ground potential Vss, forming two inverters. Respective output nodes A and B of the inverters are cross-connected with gates of N type MOSFETs Q1 and Q2, forming one flipflop circuit. Nodes A and B function as storage nodes of the memory cell.

Each of N type MOSFETs Q3 and Q4, which are access transistors, has source/drain terminals connected between one of the pair of bit lines BL and /BL and one of the pair of storage nodes A and B of the memory cell, and a gate connected to a common word line WL.

Usually, for reduction in memory cell area, transistors Q1, Q2, Q3 and Q4 of the same conductivity type forming the memory cell are formed at a surface of a silicon substrate, and highly resistive load elements R1 and R2 are formed thereon with an interlayer insulating film interposed therebetween.

An example of the memory cell in which a highly resistive load element is formed at a layer over a transistor as described above is disclosed in an article by T. Wada et al., "A 34-ns 1-Mbit CMOS SRAM Using Triple Polysilicon", IEEE Journal of Solid State Circuits, Vol-SC22, No. 5, October 1987, pp. 727–732.

FIG. 20 shows a memory cell of a CMOS type in which the resistive load in FIG. 19 is replaced by a P type MOSFET. If the P type MOSFET is formed by a thin film transistor (TFT) and arranged over N type MOSFETs Q1, Q2, Q3 and Q4, this memory cell can also be implemented in substantially the same memory cell area as the memory cell of a highly resistive load type shown in FIG. 19.

An example of a memory cell utilizing a TFT transistor is disclosed in an article by K. Sakai et al., "A 9-ns 1-Mbit CMOS SRAM", IEEE Journal of Solid State Circuits, Vol-24, No. 5, October 1989, pp. 1219–1225.

Problems of a memory cell in a conventional static type semiconductor memory device will be described below by taking a memory cell of a highly resistive load type as an example.

FIG. 21 shows a layout of the memory cell shown in the equivalent circuit diagram of FIG. 19. Since the mask pattern for forming the memory cell in FIG. 19 consists of many layers, the layers thereof are divided as shown in FIGS. 21(a), (b) and (c) for illustration of the whole structure. The layers shown in FIGS. 21(a), (b) and (c) actually overlap with each other.

Referring to FIG. 21(a), portions, where active layer regions 31a and 31b formed at the surface of the silicon substrate are overlapped with first polysilicon patterns 32a and 32b, correspond to channel regions of driving N type MOSFETs Q1 and Q2 shown in FIG. 19, respectively. First polysilicon patterns 32a and 32b correspond to the gates of N type MOSFETs Q1 and Q2. Portions where active layer regions 31a and 31b are overlapped with first polysilicon patterns 32c and 32d correspond to channel regions of the access transistors, N type MOSFETs Q3 and Q4, shown in FIG. 19, respectively.

First polysilicon patterns 32c and 32d corresponding to the gates of the access transistor N type MOSFETs Q3 and Q4 correspond to word line WL in FIG. 19. First buried contacts 41a and 41b are formed by opening contact holes at a gate oxide film formed at the surface of the silicon active layer, through which contacts first polysilicon patterns 32a and 32b are connected to the surface of the silicon substrate. These connections form the cross-connections of the gates and drains of N type MOSFETs Q1 and Q2 shown in FIG. 19.

Regarding the pattern formed at a layer over this pattern, a second polysilicon pattern 43 is used as an interconnection for connecting the memory cell to the ground, as shown in FIG. 21(b). Second polysilicon pattern 43 is connected to the surface of the silicon substrate through second buried contacts 42a and 42b, thereby forming interconnections for connecting sources of N type MOSFETs Q1 and Q2 in FIG. 19 to the ground. Third polysilicon patterns 44a and 44b function as interconnections for connecting resistors R1 and R2 in FIG. 19 and connecting these resistors and power supply potential $V_{CC}$.

Regarding a further upper pattern, with reference to FIG. 21(c), ions are implanted to third polysilicon patterns 44a and 44b by using a mask pattern 46 as a mask to reduce interconnection resistance at the unmasked portion. Portions where mask pattern 46 is overlapped with third polysilicon pattern 44 become highly resistive polysilicon, serving as load resistors R1 and R2 of the memory cell. Metal interconnections 36a and 36b correspond to bit line pair BL and /BL and connected to the surface of the silicon substrate to contact holes 35a and 35b. As a result, bit line pair BL and /BL and access transistors Q3 and Q4 are connected respectively.

As a metal interconnection, an Al—Si interconnection, an Al—Si—Cu interconnection or the like is used.

FIG. 22 is a cross sectional view taken along the lines A–A' and B–B' in the patterns shown in FIG. 21 (the mask patterns in the lithography process of manufacturing a semiconductor device are formed based on these patterns). A field oxide film 52 for element isolation is formed on a silicon substrate 51. A portion of a silicon substrate 51 which is not covered by field oxide film 52 acts as a silicon active region. An access transistor is formed by $N^+$ source/drain regions 54a and 54b and first polysilicon gate layer 32c formed on the silicon active layer with the gate oxide film interposed therebetween, and a portion immediately under first polysilicon gate layer 32c serves as a channel portion of the access transistor. In contrast, first polysilicon layer 32d is a mere interconnection since it is located on field oxide film 52 in this cross section. Second polysilicon pattern 43 applies the ground potential. Third polysilicon pattern 44b in FIG. 21 corresponds to two regions of interconnection portion 69 having a reduced resistance and a load resistance portion 70 having a increased resistance by ion implantation. Bit line 36a is a metal interconnection and connected to N+ source/drain region 54a through contact hole.

Next, operations of the highly resistive load type memory cell shown in FIG. 19 will be described. The following description is made by placing a special emphasis on stability of the memory cell operations at a low voltage. It is assumed that storage node B is at an "H" (High) level in a stand-by state.

Since access transistors Q3 and Q4 in the memory cell are turned off in the stand-by state, the inverters of the memory cell are formed by driver transistors Q1 and Q2 and highly resistive loads R1 and R2 and have a high voltage gain. In other words, an output of the inverter makes a steep transition near the logic threshold value. In this case, noise margin is considerably large and data is stably held.

During data readout, access transistors Q3 and Q4 in the memory cell are turned on whereby a current flows from/bit line /BL to storage node B at an "L" (Low) level. More specifically, this is equivalent to the state where a load with a low impedance is connected in parallel to a load element and no resistive load with a high impedance is present. Therefore, the inverter in the memory cell must be treated as an N type enhancement MOS load type having an access transistor Q3 or Q4 as a load. At this time, the gain of the inverter is considerably reduced from that in the stand-by state and the output of the inverter makes a more gradual transition. This is the most dangerous moment for the memory cell when a bistable state is lost and data is destroyed unless it has a sufficient noise margin.

In order to suppress the consumed current sufficiently in the stand-by state, the resistance of the highly resistive load element is a sufficiently great value such as approximately 10 TΩ and the potential of the storage node corresponding to an "H" level immediately after writing is at a level of $V_{CC}-V_{thn}$, a level lower than the power supply voltage by the threshold voltage ($V_{thn}$) of the access transistor. Therefore, analysis of bistability of a memory cell must be carried out for the readout operation immediately after writing when the operation margin is the smallest.

Readout characteristics of the memory cell immediately after writing is shown in FIG. 23(a) and the circuit structure of the memory cell corresponding to the readout characteristics is shown in FIG. 23(b). A curve α in FIG. 23(a) indicates the characteristics of an inverter formed by access transistor Q2 and driver transistor Q4, and a curve β indicates the characteristics of an inverter formed by access transistor Q1 and driver transistor Q3. The effects of resistive loads R1 and R2 can be ignored since a current flowing therethrough is small, as described above.

Crossing points a and b of curves α and β are the stable points of the memory cell, and point a corresponds to the case where data of "0" is stored and point b corresponds to the case where data of "1" is stored.

A portion C in FIG. 23(a) corresponds to a threshold voltage $V_{athn}$ of access transistor Q4, and a portion D corresponds to a threshold voltage $V_{athn}$ of driver transistor Q1. The remaining portion E obtained by subtracting portions C and D from power supply voltage $V_{CC}$ corresponds to a margin region for stabilizing readout operations of the memory cell. It is difficult to reduce threshold voltages of an access transistor and a driver transistor to a certain value or lower, since the subthreshold leakage current of these transistors must be suppressed sufficiently. Therefore, margin region E is decreased with lower operation voltage $V_{CC}$, whereby readout operations are not stabilized.

Portions indicated by p and q in FIG. 23(a) are called an "eye of a cell", and a region corresponding to the eye of a cell is smaller where the power supply voltage is lower, and operations are instabilized.

Therefore, in order to improve the operation margin of the memory cell during low voltage operations as much as possible, a ratio (cell ratio) of the current supplying capabilities of the driver transistor to the access transistor is sufficiently increased.

More specifically, when an "H" level is stored in storage node A and the current supplying capability of driver transistor Q2 is greater than that of access transistor Q4 which transistors are connected to storage node B where an "L" level is stored, then the potential of storage node B is stabilized at an "L" level. This means that the value indicated by F in FIG. 23(a) is decreased.

Here, the current supplying capability of an MOS transistor is generally expressed by the value of β in the following equation:

$$I_D = \beta(V_{GS}-V_{th})^2/2 \qquad (1)$$

where $I_D$ indicates a drain current in a saturation region, $V_{GS}$ indicates a voltage between the gate and the source and $V_{th}$ indicates the threshold voltage of the transistor.

The cell ratio has been set at a value of 3 or more with the operation margin in view.

However, the value β is proportional to W/L where W is a channel width and L is a channel length of a transistor. Thus, setting the cell ratio at a value of 3 or more leads to greater areas of driver transistors Q3 and Q4, thereby preventing reduction in area of the memory cell.

Description will now be made of a second conventional example for enhancing stability in operation of the memory cell at a low voltage.

FIG. 24 is a circuit diagram showing an equivalent circuit of a memory cell in the second conventional example. It is different from the first example shown in FIG. 19 in that N type MOSFETs used as access transistors Q3 and Q4 are replaced by P type MOSFETs. Since a P type MOSFET is utilized as an access transistor in this example, the word line obtains an "L" level when selected.

To clarify illustration of operations of the memory cell in the second example shown in FIG. 24, the memory cell is divided into two inverters as shown in FIGS. 25(a) and (b). The potential of storage node A will be hereinafter indicated by V(2) and the potential of storage node B indicated by V(1). When the memory cell is in a readout state, i.e. access transistor Q3 or Q4 is turned on, effects of load resistive elements R1 and R2 can be neglected as stated in the first example. Therefore, the memory cell inverter must be treated as the CMOS type having access transistor Q3 or Q4 as a load.

Since access transistors Q3 and Q4 are N type MOSFETs in the first example, operation power supply voltage Vcc is required to satisfy the following relationship:

$$V_{CC} > V_{athn}+V_{dthn} \qquad (2)$$

More specifically, the relationship above must be satisfied in order to secure margin region E shown in FIG. 23. For example, assuming that the driver transistor has threshold voltage $V_{dthn}$ of 0.8 V and the access transistor has threshold voltage $V_{athn}$ of 1.3 V taking into account a rise in the threshold voltage due to back gate effects, then $V_{CC}$ is required to exceed 2.1 V. Therefore, it is difficult to operate this memory cell at a low voltage.

With the structure of the second example shown in FIG. 24, however, voltage drop by the threshold voltage of the transistor can be neglected since access transistors Q3 and Q4 are P type MOSFETs, and thus operation power supply voltage Vcc is required only to satisfy the following relationship:

$$V_{CC} > V_{dthn} \qquad (3)$$

If $V_{dthn}$ is, for example, 0.8 V, the memory cell can operate at as small a voltage as $V_{CC}=1$ V.

FIG. 26 plots the transfer characteristics of two inverters forming the memory cell in the selected state shown in FIG. 25 to a V(1)–V(2) plane. It should be noted that all the characteristics shown in FIG. 26 are obtained when the cell ratio is equal to 1.

The crossing point of the transfer characteristics of the two inverters is the stable point of the memory cell. Note that the crossing point in the middle is a unstable point and crossing points a and b shown in the left upper portion and right lower portion of the graph are the stable points. The three kinds of curves in FIG. 26 correspond to the cases where $V_{CC}$ is equal to 1 V, 2 V, and 3 V, respectively, and two stable points are present for each case. The "eyes of a cell" formed by the transfer characteristic curves of the inverters at respective power supply voltage conditions indicate the static noise margin of the bistable circuit. The stability thereof is enhanced as the margin is increased. The results of the simulation shown in FIG. 26 suggest that the memory cell can operate at a voltage $V_{CC}$ of 1 V.

Therefore, with such a structure as in the second example, the condition requiring the cell ratio of 3 or more in the first example need not be satisfied, so that the access transistor and the driver transistor can be substantially equal in size.

However, in this case as well, an N type MOSFET and a P type MOSFET must be formed at the same time in the same memory cell, leading to an undesirable increase in area of the isolation region for element isolation.

Since the conventional static type semiconductor memory device has a memory cell with a structure as described above, it has the following problems.

First, if the access transistor and the driver transistor are both N type MOSFETs, the driver transistor must be increased in size to achieve low voltage operations, making it difficult to reduce the area of the memory cell. In addition, even if the cell ratio is increased, there is a limit to low voltage operations.

Secondly, if the access transistor is formed as a P type MOSFET to achieve low voltage operations, the area of an isolation region between elements is increased, thereby preventing reduction in area of the memory cell.

SUMMARY OF THE INVENTION

One object of the present invention is to provide a static type semiconductor memory device including a memory cell having a sufficient operation margin even when a power supply voltage is low.

Another object of the present invention is to provide a statistic type semiconductor memory device capable of reducing memory cell area and achieving low voltage operations.

Briefly stated, the present invention relates to a static type semiconductor memory device which includes a memory cell array having a plurality of word lines, a plurality of bit line pairs crossing the plurality of word lines and a plurality of memory cells connected to the word lines and the bit line pairs. Each memory cell includes a pair of bipolar transistors having base regions of a first conductivity type with their emitters connected to first power supplies and bases and collectors are cross-connected to each other, a pair of load elements connected between second power supplies and the collectors of the pair of bipolar transistors, and a pair of first conductivity type channel MOS transistors which have gates connected to the word line and are each connected to form a conduction path between the collector of one of the pair of bipolar transistors and the corresponding bit line.

According to another aspect of the present invention, a static type semiconductor memory device, including a memory cell formed by a flipflop circuit in which inputs and outputs of two inverters are coupled to each other, is provided which includes a semiconductor substrate, a group of transistors, an interlayer insulating layer, and a plurality of load elements. The semiconductor substrate has a main surface. The group of transistors has plural sets of a pair of access MOS transistors and a corresponding pair of driving bipolar transistors of a lateral type formed at the main surface of the semiconductor substrate. The interlayer insulating layer covers a surface of the transistor group. Load elements form a pair corresponding to each pair of the driving bipolar transistors of a lateral type and are formed on the interlayer insulating layer. The load element has one end connected to a first power supply and another end connected to the driving bipolar transistor of a lateral type, and the driving bipolar transistor of a lateral type has an emitter connected to a second power supply, so that each load element and the corresponding driving bipolar transistor of a lateral type form an inverter. The pair of driving bipolar transistors of a lateral type have collectors and bases which are cross-connected to each other, and base regions each having a common region shared with one of source/drain regions of the access MOS transistor.

According to still another aspect of the present invention, a static type semiconductor memory device having a thin film semiconductor layer on an insulator as a main surface and formed on an SOI substrate is provided which includes a memory cell array having a plurality of word lines, a plurality of bit line pairs crossing the plurality of word lines, and a plurality of memory cells connected to the word lines and the bit line pairs. Each memory cell includes a pair of bipolar transistors formed at the thin film semiconductor layer and having emitters connected to first power supplies, bases and collectors cross-connected to each other, and base regions of a first conductivity type; a pair of load elements connected to form conduction paths between second power supplies and the collectors of the pair of bipolar transistors; and a pair of first conductivity type channel MOS transistors formed at the thin film semiconductor layer and having gates connected to the word line, and connected between the collectors of the pair of bipolar transistors and the bit lines.

According to a further aspect of the present invention, a static type semiconductor memory device having a thin film semiconductor layer on an insulator as a main surface and formed on an SOI substrate is provided which includes a group of transistors, an interlayer insulating layer and a plurality of load elements. The group of transistors has plural sets of a pair of access thin film MOS transistors and a pair of driving bipolar transistors of a lateral type formed at the thin film semiconductor layer. The interlayer insulating layer covers a surface of the transistor group. Load elements form a pair corresponding to each pair of driving bipolar transistors of a lateral type, and are formed on the interlayer insulating layer and connected to the driving bipolar transistors of a lateral type through contact holes formed at the interlayer insulating layer. The load element has one end connected to a first power supply and another end connected to a collector of the driving bipolar transistor of a lateral type, which has an emitter connected to a second power supply, so that the load element and the corresponding bipolar transistor of a lateral type form an inverter. The pair of driving bipolar transistors of a lateral type have collectors and bases which are cross-connected to each other, and base regions each having a common region shared with one of source and drain regions of the access thin film MOS transistor. The collector region of the driving bipolar transistor of a lateral type is formed by a region of the same conductivity type extending from a surface of the thin film semiconductor layer to an interface with the insulator. A contact hole is open to the collector region of one transistor and to the base region of the other transistor of the pair of driving bipolar transistors of a lateral type.

Therefore, an advantage of the present invention is that low voltage operations can be achieved, since the driving transistor of an inverter forming a memory cell is a bipolar transistor and thus the logic threshold of the inverter is determined by a threshold voltage of the bipolar transistor.

Another advantage of the present invention is that since the access MOS transistor and the driving bipopolar transistor of a lateral type forming the memory cell have a common region shared by the source/drain region and the base region, reduction in memory cell area can be achieved as compared with the case where these regions are formed separately.

A still another advantage of the present invention is that reduction in memory cell area can be achieved, since the access transistor and the driving bipolar transistor are formed at the thin film semiconductor layer on the insulator and element isolation of the pair of driving bipolar transistors are effected by the collector region.

A further advantage of the present invention is that reduction in memory cell area can be achieved with a smaller number of contact holes, since the collector region of one transistor and the base region of the other transistor of the pair of driving bipolar transistors of a lateral type forming a memory cell are connected by an interconnection layer formed at the contact hole which is open to both of these regions.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing an equivalent circuit of a memory cell in a static type semiconductor memory device according to a first embodiment of the present invention.

FIGS. 2(a) and 2(b) are a circuit diagram showing a second equivalent circuit of the memory cell according to the first embodiment of the present invention, in which (a) shows an equivalent circuit of a first inverter, and (b) shows an equivalent circuit of a second inverter.

FIGS. 8–8i are a cross sectional view showing the flow of the steps for manufacturing the memory cell according to the second embodiment of the present invention in which (f) through (i) show the cross sections in the sixth through ninth steps, respectively.

FIGS. 10a–10d are a plan view showing patterns of the memory cell according to the third embodiment of the present invention in which (a) through (d) show patterns of the layers of first through fourth groups, respectively.

FIGS. 21a–21c are a plan view showing patterns of the resistive load type memory cell according to the first conventional example in which (a) to (c) show patterns of a bottom layer, an intermediate layer, and an upper layer, respectively.

DESCRIPTION OF THE PREFERRED EMBODIMENTS

First Embodiment

FIG. 1 is a circuit diagram showing a structure of a memory cell of a static type semiconductor memory device according to the first embodiment of the present invention.

This structure is different from that of the second conventional example in that driver MOSFETs Q1 and Q2 are replaced with NPN bipolar transistors T1 and T2.

More specifically, highly resistive elements R1 and R2 are connected with collectors of NPN bipolar transistors T1 and T2, respectively, which have emitters coupled to a ground potential. NPN bipolar transistors T1 and T2 have their bases and collectors cross-connected with each other. A P type MOSFET Q3 is connected between bit line BL and a connection point between highly resistive element R1 and the collector of transistor T1, while a P type MOSFET Q4 is connected between/bit line /BL and a connection point between highly resistive element R2 and the collector of transistor T2.

Description will now be made of operations. Since an NPN bipolar transistor has operation characteristics different from those of an N type MOSFET, operations of the memory cell will be described with reference to FIGS. 2–4.

Figure 25:
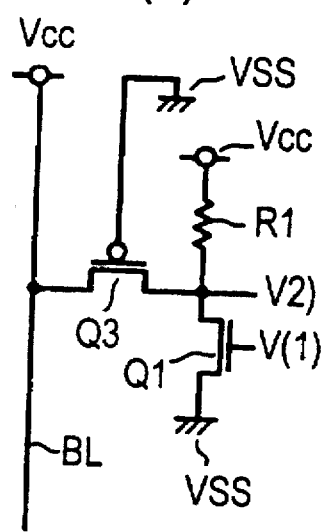
FIG. 25 is a second equivalent circuit diagram of the second example in which (a) shows an equivalent circuit of a first inverter, and (b) shows an equivalent circuit of a second inverter.
Figure 25:
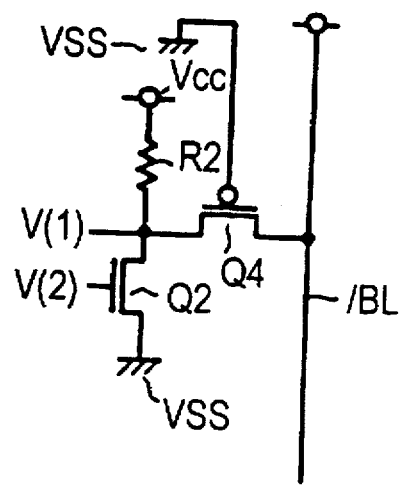
Figure 26:
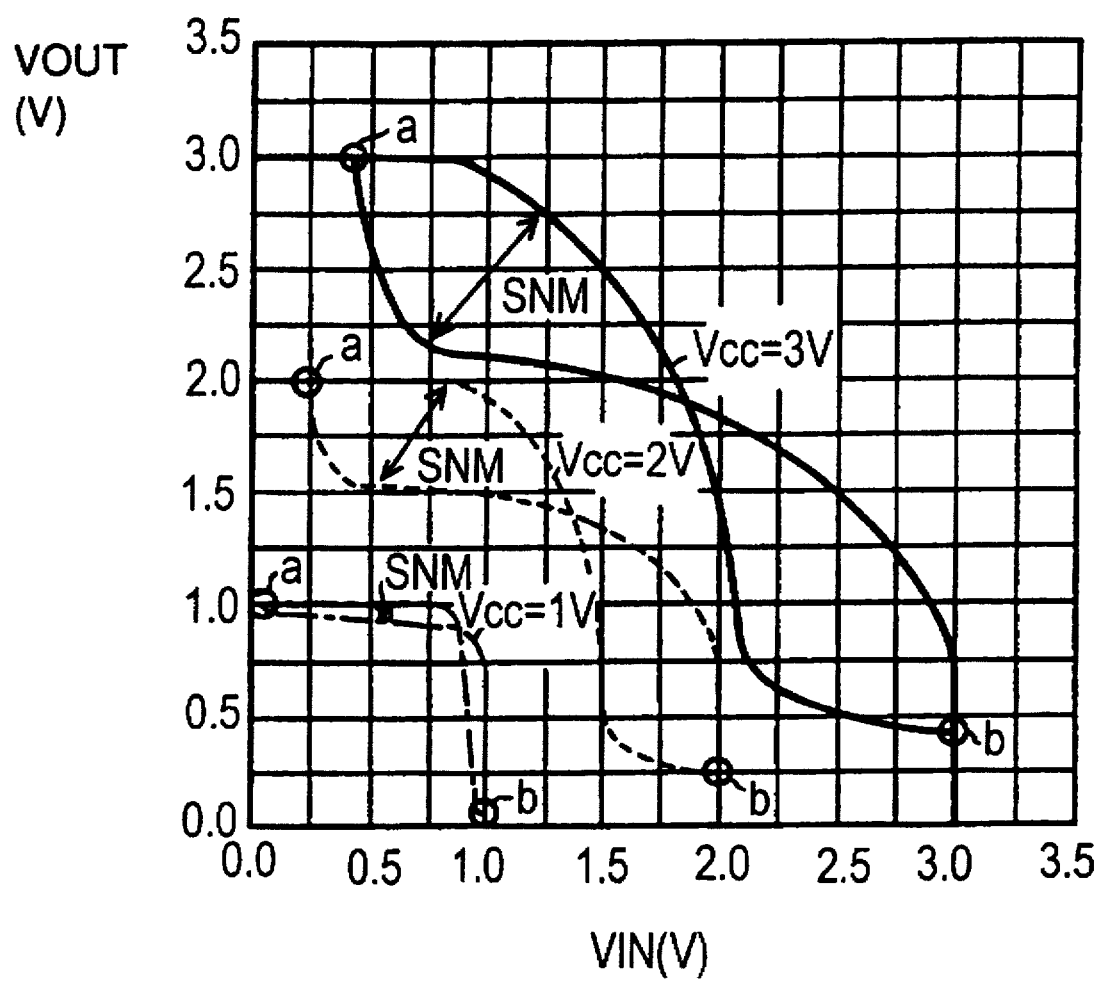
FIG. 26 is a graph for use in illustration of operation, showing curves of data readout characteristics of a memory cell in the second conventional example.

Similarly to the second conventional example shown in FIG. 25, the memory cell is divided into two inverters, as shown in FIG. 2. It is appreciated that since the bipolar transistor has a base input clamped by a PN junction diode between the base and the emitter, diodes 14 and 15 are attached to outputs of respective inverters to be equivalent to the circuit shown in FIG. 1. Parasitic resistors Rb1 and Rb2 of the bases are connected between storage nodes A and B and diodes 14 and 15, respectively, because they cannot be neglected in analyzing the operations. Base parasitic resistors 16a and 16b, and 17a and 17b are essentially the same parasitic resistors. However, in dividing the memory cell into two inverters, each resistor connected to an input of the inverter has a value obtained by dividing the original resistance value.

Figure 3:
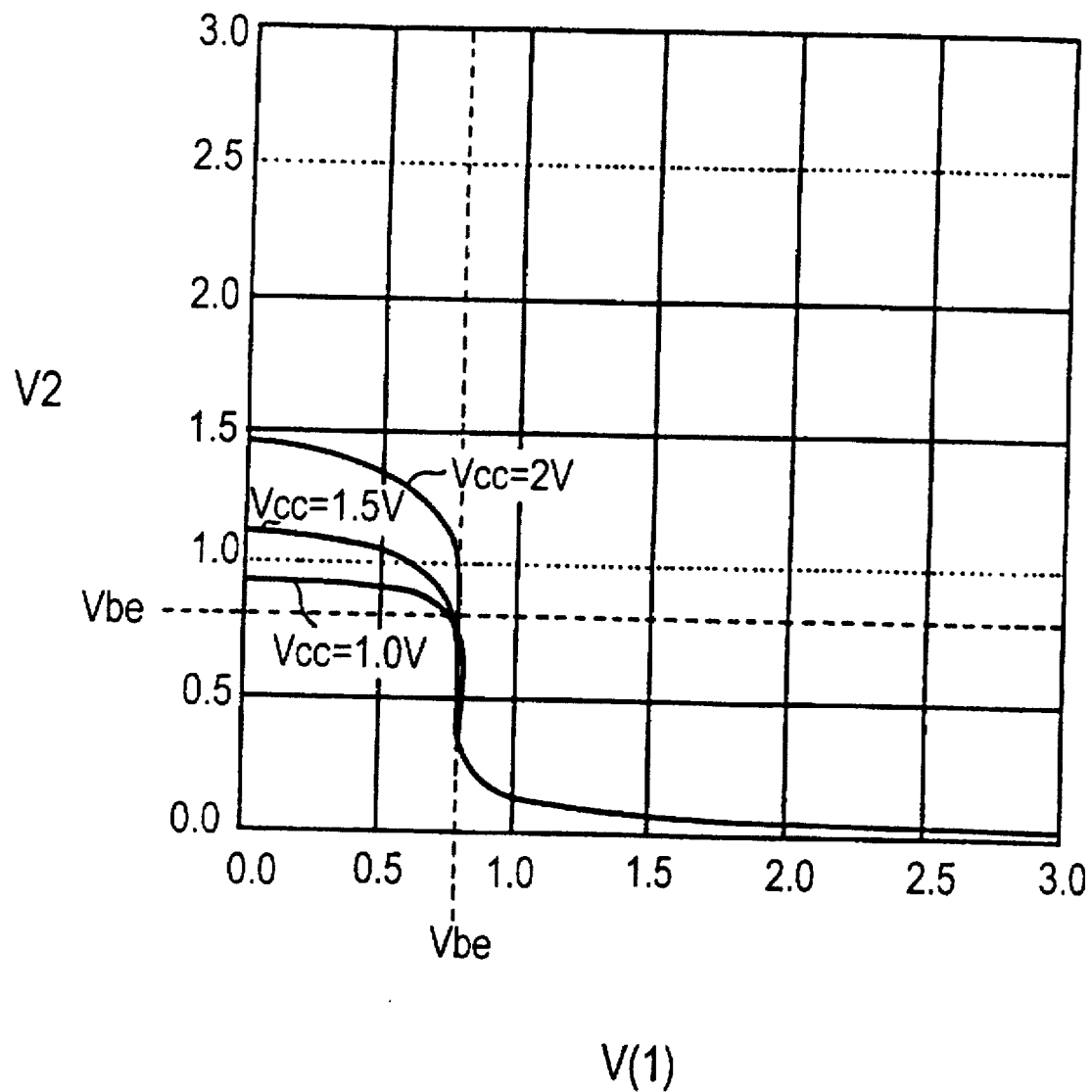
FIG. 3 is a graph for use in illustration of operations, showing transfer characteristics of the inverter forming the memory cell according to the first embodiment of the present invention.

FIG. 3 shows transfer characteristics of the inverter shown in FIG. 2(a). In the graph, the three curves correspond to the cases where $V_{CC}$ equals to 1.0 V, 1.5 V, 2.0 V, respectively. When input voltage V(1) of the inverter is increased and reaches a threshold voltage Vbe of the bipolar transistor, NPN bipolar transistor T1 attains an ON state, whereby potential V(2) of the output node changes from the potential of an "H" level to an "L" level.

Figure 4:
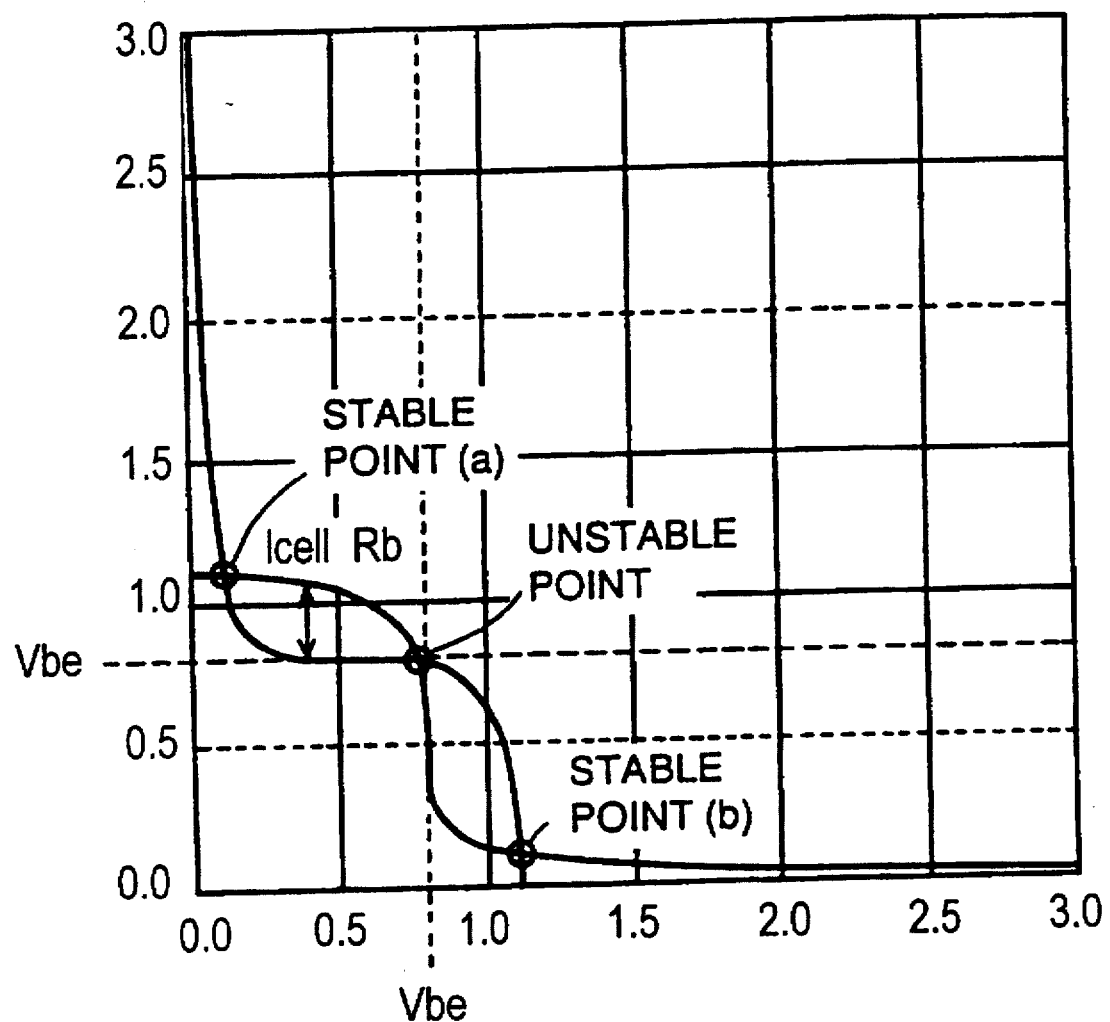
FIG. 4 is a graph for use in illustration of operations, showing transfer characteristics of the memory cell according to the first embodiment of the present invention.

FIG. 4 shows transfer characteristics of the inverters shown in FIGS. 2(a) and (b) overlapped with each other. It can be seen from the graph that two stable points are obtained as the conventional example, thereby allowing operation as a memory cell. FIG. 4 shows the case where $V_{CC}$ is equal to 1.5 V. The amount corresponding to the "eye of a cell" indicated by the arrow in FIG. 4 is the difference between threshold voltage $V_{be}$ of the bipolar transistor and potential V(2) of storage node A at an "H" level.

When storage node A is at an "H" level in the readout state, NPN bipolar transistor T1 is in an OFF state, so that a current flows to the memory cell from the bit line through access transistor Q3, base parasitic resistor Rb1 and diode 14. Expressing the value of this current as $I_{cell}$, potential V(2) of storage node A is the potential higher than clamp potential $V_{be}$ of diode 14 by the product of current $I_{cell}$ and parasitic base resistance Rb. As a result, the amount indicated by the arrow and corresponding to the "eye of a cell" in FIG. 4 is $I_{cell}$Rb.

Thus, in the present embodiment the memory cell can operate under the following condition:

$$V_{CC} > V_{be} \tag{4}$$

where $V_{be}$ is a threshold voltage between the base and the emitter of the bipolar transistor as described above. Since usually voltage $V_{be}$ is approximately 0.7 V, the memory cell can operate even when power supply voltage $V_{CC}$ is as low as 1 V.

Second Embodiment

The first embodiment has demonstrated that the memory cell expressed by the equivalent circuit diagram in FIG. 1 is suitable for low voltage operations. In the second embodiment, a memory cell structure is provided which can reduce the area of the memory cell shown in the equivalent circuit diagram of FIG. 1.

Figure 5C:
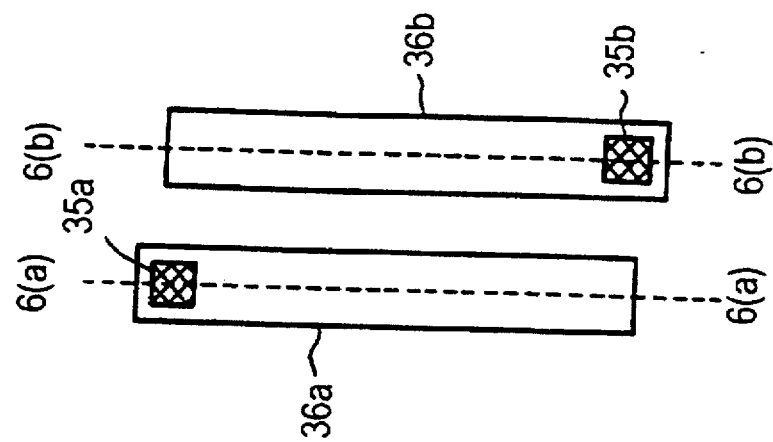
FIGS. 5a–5c are a plan view showing patterns of a memory cell according to the second embodiment of the present invention in which (a) shows a pattern of a bottom layer, (b) shows a pattern of an intermediate layer, and (c) shows a pattern of an upper layer.
Figure 5B:
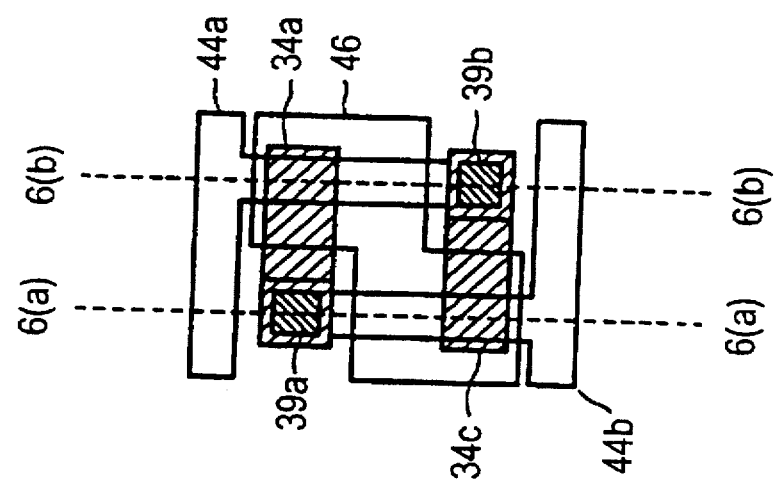
Figure 5A:
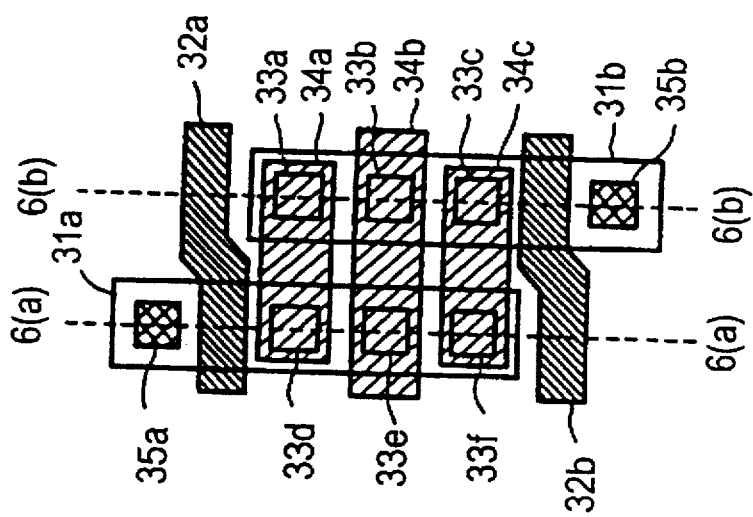

FIG. 5 is a plan view showing patterns according to the second embodiment of the present invention. The portions, where first polysilicon patterns 32a and 32b are overlapped with the silicon active layer formed at the surface of the silicon substrate, such as P type regions 31a and 31b, form channel portions of the active MOS transistors. More specifically, first polysilicon patterns 32a and 32b correspond to gates of access transistors Q3 and Q4 in FIG. 1, respectively.

Thus, the first polysilicon patterns 32a and 32b also correspond to word line WL. The second polysilicon pattern 34b corresponds to a ground interconnection, while second polysilicon patterns 34a and 34c correspond to storage nodes A and B of the memory cell, respectively. First buried contacts 33d and 33c correspond to the contacts for the base regions of NPN bipolar transistors of a lateral type, connecting second polysilicon patterns 34c and 34a with the surface of the silicon substrate. First buried contacts 33b and 33e are emitter contacts of lateral type NPN bipolar transistors, and first buried contacts 33a and 33f are the contacts for the collectors of the lateral type NPN bipolar transistors.

The patterns formed at a layer over such patterns will be described with reference to FIG. 5(b). Third polysilicon patterns 44a and 44b are the interconnections each connecting the collector of driving NPN bipolar transistor of lateral type and power supply potential $V_{CC}$. By performing ion implantation with use of mask pattern 46 as a mask, resistance value of the implanted portion is reduced to serve as an interconnection and the unimplanted portion serves as a highly resistive element.

Referring to FIG. 5(c), as the patterns formed at a further upper layer, metal interconnections 36a and 36b correspond to bit line pair BL and /BL in FIG. 1 and connect to the surface of the silicon substrate through contact holes 35a and 35b.

Therefore, this structure is different from that of the first conventional example shown in FIG. 21 in that the patterns of active regions 31a and 31b are changed because the bipolar transistor is used as a driving element of the memory cell and that second polysilicon patterns 34a–34c connecting these patterns are changed.

Figure 6:
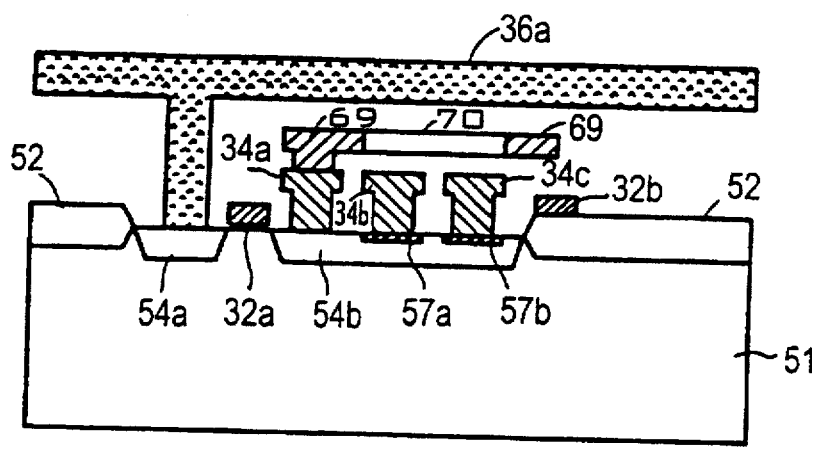
FIGS. 6a–6b are a cross sectional view showing cross-sectional structures of the second embodiment of the present invention in which (a) shows the cross section taken along the line 6(a)—6(a) in FIG. 5 and (b) shows a cross section taken along the line 6(b)—6(b) in FIG. 5.
Figure 6:
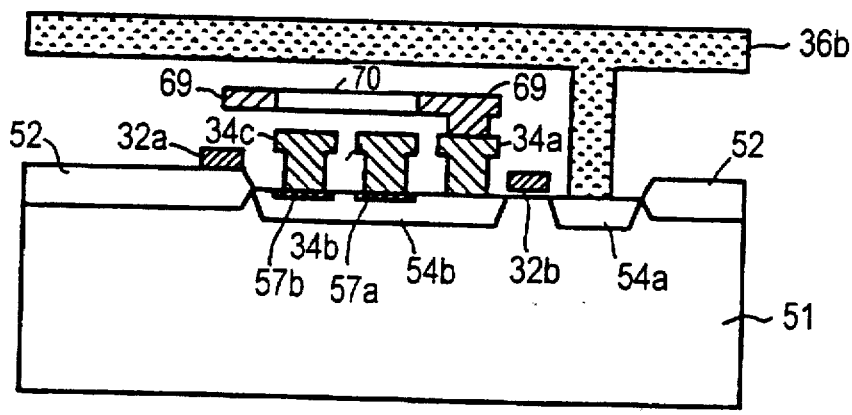

FIG. 6 is a cross sectional view in which (a) and (b) show cross sections taken along the lines A–A' and B–B' in FIG. 5, respectively. On silicon substrate 51, field oxide film 52 for element isolation is formed. The portion at the surface of silicon substrate 51 which is not covered by field oxide film 52 functions as the silicon active layer. Region 54b of the P$^+$ type source/drain region is integrally formed with the base region of the bipolar transistor. An N type silicon layer 57a is formed by ion implantation with use of first buried contact pattern 33e as a mask and corresponds to the emitter region of the NPN bipolar transistor. An N type silicon layer 57b is formed by ion implantation with use of first buried contact pattern 33f as a mask and corresponds to the collector region of the NPN bipolar transistor.

First polysilicon patterns 32a and 32b each form an MOS type transistor at the surface of the silicon active layer. More specially, in FIG. 6(a), first polysilicon pattern 32a forms the gate of the P type MOSFET and first polysilicon pattern 32b is located on field oxide film 52 in the cross section A–A', serving merely as an interconnection.

Second polysilicon patterns 34a, 34b and 34c are connected to the surface of silicon substrate 51 through first buried contacts 33d, 33e and 33f. Metal interconnection 36a is connected to the surface of silicon substrate 51 through contact hole 35a.

Since FIG. 6(b) is the mirrored version of (a) of FIG. 6 and corresponding portions are identical, description thereof will not be repeated.

FIGS. 7(a)–(e) and FIGS. 8(f)–(i) are cross sectional views showing the flow of the steps of manufacturing the memory cell having the cross sectional structure shown in FIG. 6.

First, a surface of an N type silicon substrate is oxidized to form an SiO$_2$ film 10. An Si$_3$N$_4$ film 12 used as a mask for selective oxidation is formed by CVD method. Thereafter, photoresist for forming an element isolation pattern is prepared, the Si$_3$N$_4$/SiO$_2$ film is etched, and the photoresist is removed (FIG. 7(a)).

Next, selective oxidation is performed by using the Si$_3$N$_4$/SiO$_2$ film as a mask to form field oxide film 52. The Si$_3$N$_4$/SiO$_2$ film 12 used as a mask for selective oxidation is removed (FIG. 7(b)).

Subsequently, a gate oxide film (not shown) is formed at the surface after the SiO$_2$ film is removed. A first polysilicon layer is formed and first polysilicon patterns 32a and 32b are formed by employing the mask, formed by photolithography, and dry etching (FIG. 7(c)).

The P type active regions 54a and 54b are formed by implanting ions of P type impurity with use of first polysilicon pattern 32a and field oxide film 52 as a mask followed by annealing. Although the P type impurity to be implanted is not particularly limited, by using boron (B) or the like a P type impurity region with a depth of about 0.3 μm is formed. As will be described later, P type impurity regions thus formed correspond to the source and drain regions of the access transistor and the base region of the lateral type bipolar transistor (FIG. 7(d)).

After interlayer insulating film 40 is formed, contact holes 33d, 33e and 33f are formed by employing the mask prepared by photolithography and dry etching. By using contact hole patterns 33e and 33f as a mask, ions of N type impurity are selectively implanted. After activated by annealing, N type active regions are formed corresponding to emitter region 57a and collector region 57b of a lateral type NPN bipolar transistor (FIG. 7(e)).

Figure 7:
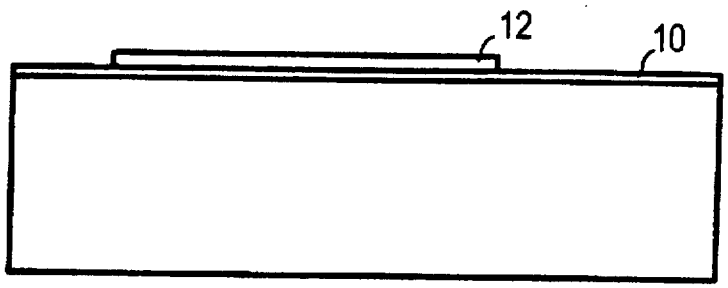
FIGS. 7a–7e are a cross sectional view showing the flow of the steps for manufacturing the memory cell according to the second embodiment of the present invention in which (a) through (e) show the cross sections in the first through fifth steps, respectively.
Figure 7:
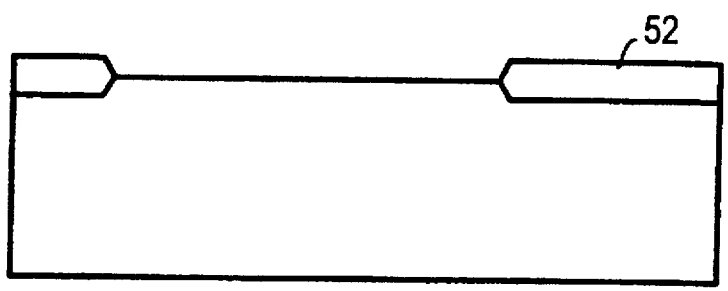
Figure 7:
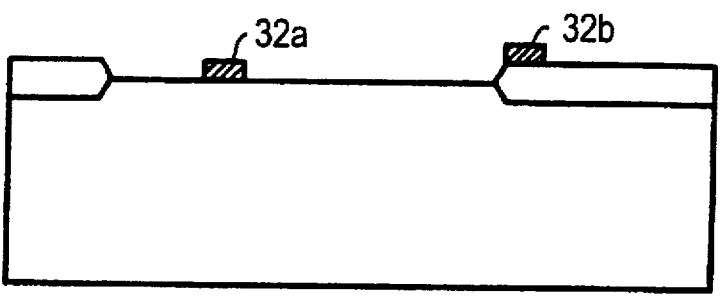
Figure 7:
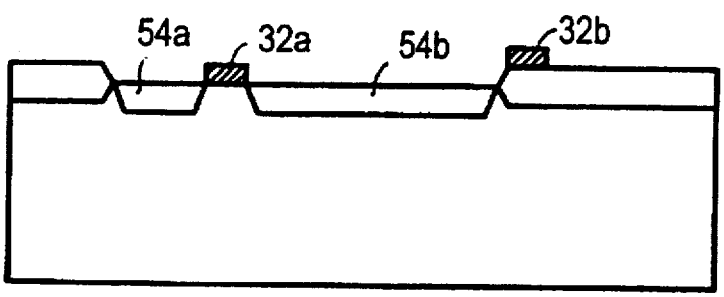
Figure 7:
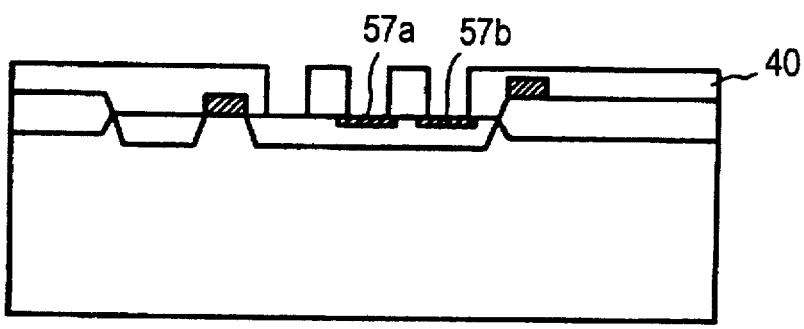

It should be noted that annealing of the P type impurity region in FIG. 7(d) can be performed simultaneously with annealing of the N type impurity region described above.

Although the N type impurity to be implanted is not particularly limited, by using arsenic (As) or the like an N type impurity region with the depth of about 0.15 μm can be formed.

A second polysilicon layer is formed, and second polysilicon patterns 34a, 34b and 34c are formed by using the mask prepared by photolithography and dry etching. An interlayer insulating film is formed again, followed by formation of second contact hole 39a (FIG. 8(f)).

Figure 8:
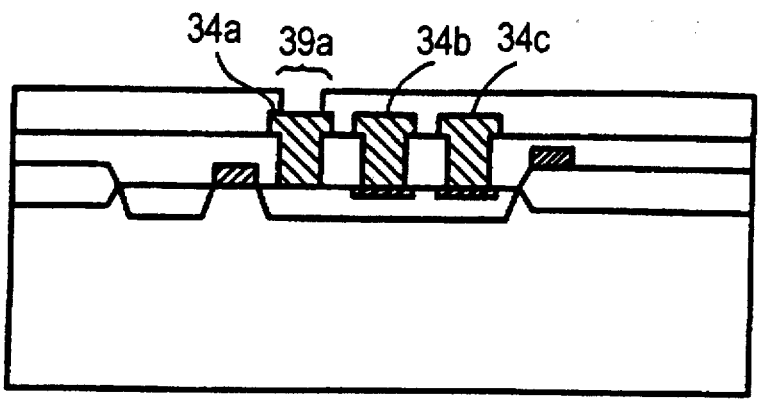
Figure 8:
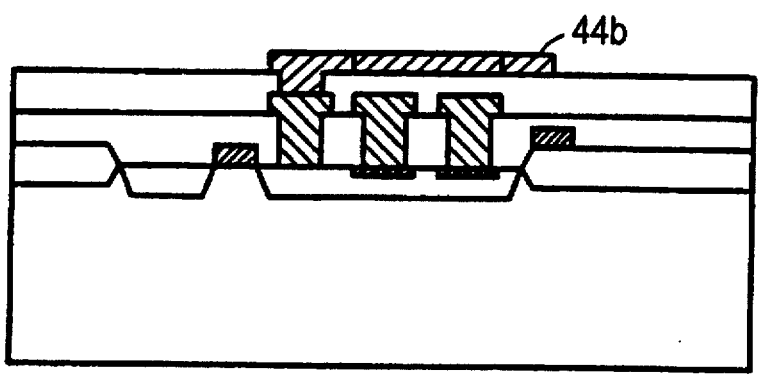
Figure 8:
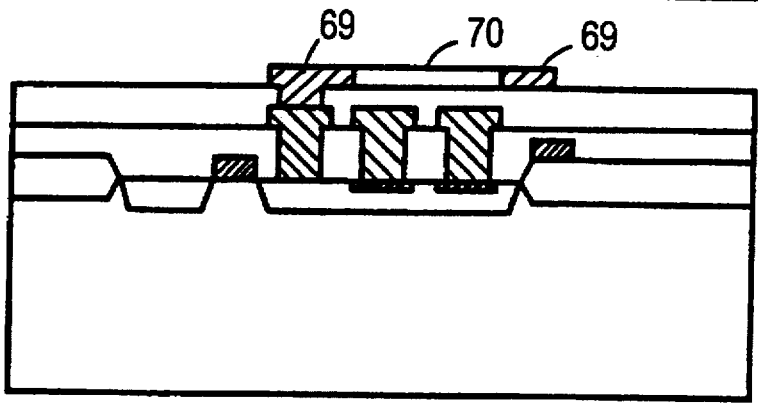
Figure 8:
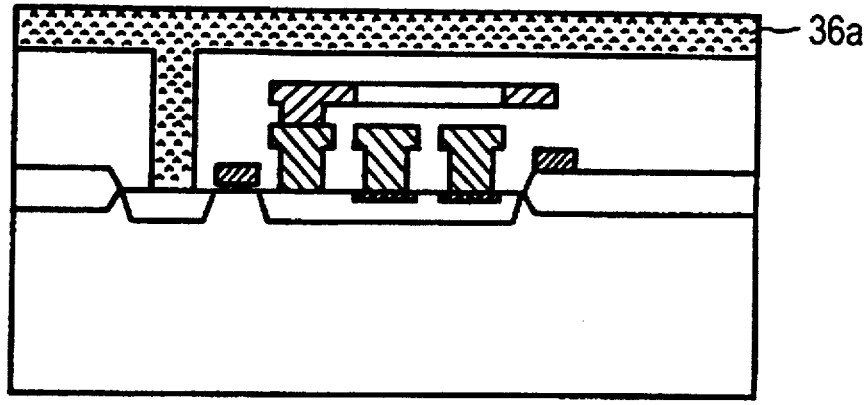

A third polysilicon layer is deposited and etched to form third polysilicon patterns 44a and 44b (FIG. 8(g)).

By using mask pattern 46 as a mask, ion implantation is performed to selectively form low resistance region 69 and high resistance region 70 (FIG. 8(h)).

After contact hole 35a is formed and metal interconnection layer 36 is deposited, metal interconnection patterns 36a and 36b are formed (FIG. 8(i)).

Through the steps above, a memory cell is formed which has a P type MOSFET, resistor 70 and a lateral type NPN bipolar transistor having N type region 57a as an emitter region, N type region 57b as a collector region, and a P type region sandwiched by emitter region 57a and collector region 57b as an intrinsic base region.

By adopting the steps above, base region 54b of the lateral type NPN bipolar transistor is integrally formed with the source/drain region of the P type MOSFET and emitter region 57a and collector region 57b are formed at the surface of the substrate in the base region, so that a memory cell including a bipolar transistor and a P type MOSFET can be formed with a reduced area.

Although in the steps above the ions of N type impurity are implanted simultaneously to emitter region 57a and collector region 57b as shown in FIG. 7(e), the present embodiment is not limited thereto. More specifically, ions of N type impurity can be implanted separately to emitter region 57a and collector region 57b so that optimum concentrations of the impurity and the optimum implanted-impurity profiles can be obtained at respective regions. In addition, the doping method of N type impurity is not limited to the ion implantation method as described above. Emitter region 57a and collector region 57b can be doped by thermal diffusion from the polysilicon pattern directly contacting these regions.

Third Embodiment

Description has been made in the second embodiment of the memory cell, having a highly resistive element as a load and a lateral type NPN bipolar transistor as a driving element, as a memory cell in the static type semiconductor memory device.

In the third embodiment, thin film transistors Q5 and Q6 are utilized as load elements in the second embodiment.

Figure 9:
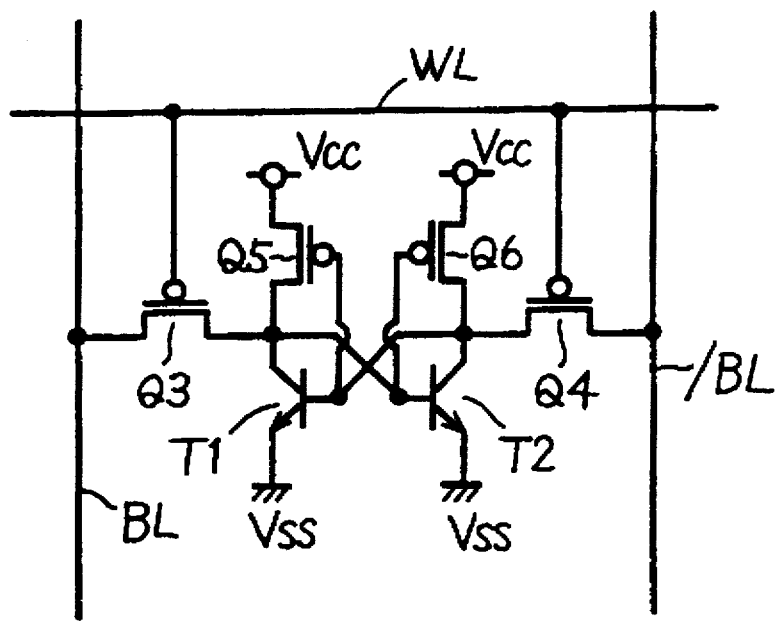
FIG. 9 is a circuit diagram showing an equivalent circuit of a memory cell according to a third embodiment of the present invention.

FIG. 9 is a circuit diagram showing an equivalent circuit of a memory cell according to the third embodiment. The present embodiment is different from the second embodiment in that thin film transistors Q5 and Q6 are employed as load elements connected to the collectors of NPN bipolar transistors T1 and T2, as described above.

FIGS. 10(a)–(d) show patterns of the memory cell in the static type semiconductor memory device according to the third embodiment, divided into several layers as in the first conventional example.

The present embodiment is different from the second embodiment in the following two points.

First, gates of thin film transistors Q5 and Q6 are formed by third polysilicon patterns 38a and 38b. The gates of thin film transistors Q5 and Q6 are connected to base regions of the lateral type NPN bipolar transistors through contact holes 39a and 39b.

Secondly, the regions of fourth polysilicon patterns 44a and 44b which are implanted with ions by using mask pattern 46 as a mask form source/drain regions of thin film transistors Q5 and Q6, and the unimplanted regions form channel regions of thin film transistors Q5 and Q6. Since the rest of the structure is similar to the second embodiment, the identical portions are labeled with the identical reference numerals and description thereof will not be repeated.

Figure 11A:
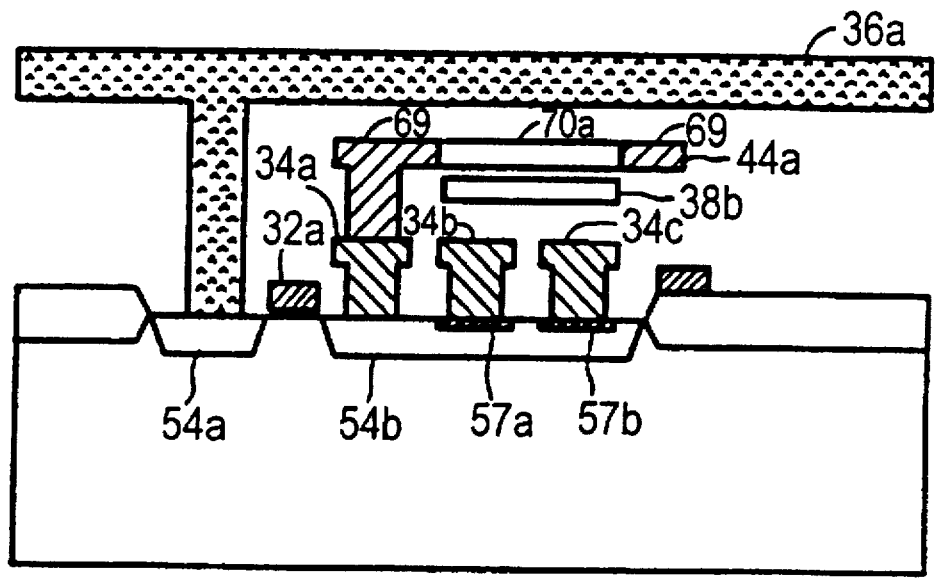
FIGS. 11a–11b are a cross sectional view showing cross sectional structures of the memory cell according to the third embodiment of the present invention in which (a) shows a cross section taken along the line 11(a)—11(a) in FIG. 10 and (b) shows a cross section taken along the line 11(b)—11(b) in FIG. 10.
Figure 11B:
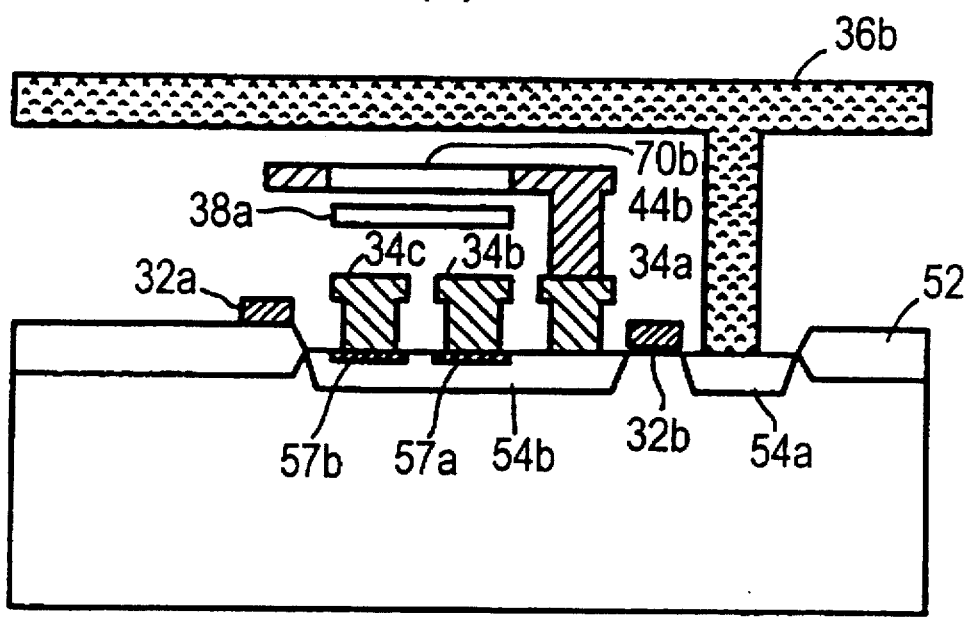

FIG. 11 is a cross sectional view in which (a) and (b) show cross sections taken along the lines A–A' and B–B' in FIG. 10. Third polysilicon patterns 38a and 38b are the gate patterns of thin film transistors Q5 and Q6. Of fourth polysilicon patterns 44a and 44b formed on gate patterns 38a and 38b with an insulating film interposed therebetween, regions 70a and 70b which are not implanted with ions are opposite to gate pattern 38a and 38b to form channel regions of thin film transistors Q5 and Q6.

As described above, with the structure in which the load elements are formed by thin film transistors Q5 and Q6, reduction in area of a memory cell can be achieved by integrally forming the base region of the lateral type NPN bipolar transistor and the source/drain region of the P type MOSFET.

Fourth Embodiment

FIG. 12 is a cross sectional view in which (a) and (b) show cross sectional structures of a memory cell in a static type semiconductor memory device according to a fourth embodiment of the present invention. Since only the active elements (the driving bipolar transistor and the access MOS transistor) at the surface of the silicon substrate are changed from the conventional example, load elements are not shown. The structure of the load element can be implemented similarly to the conventional example.

Figure 12A:
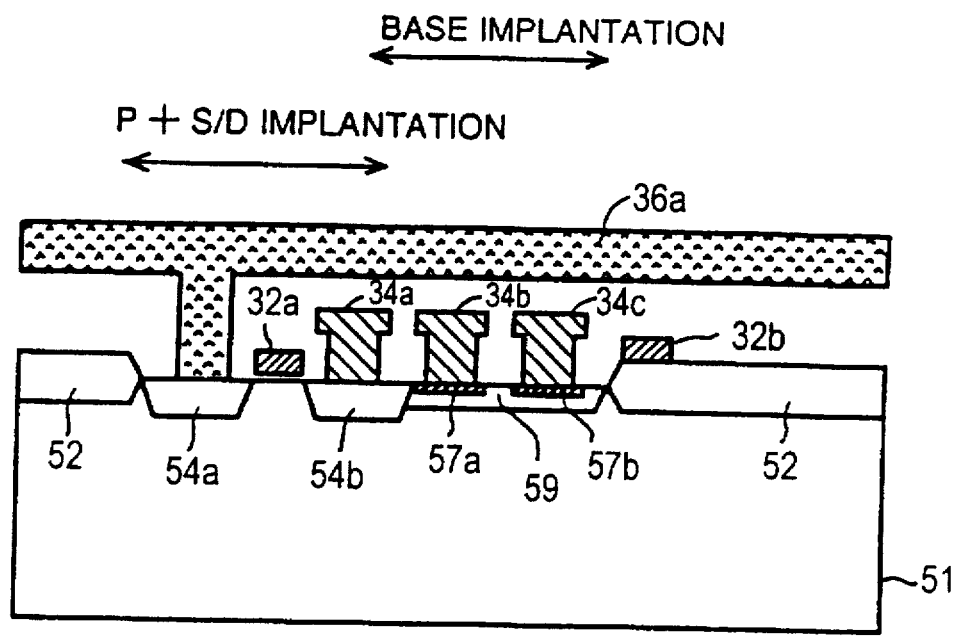
FIGS. 12a–12b are a cross sectional view showing cross sectional structures of a memory cell according to a fourth embodiment of the present invention in which (a) shows a cross section taken along the line 11(a)—11(a) in FIG. 10 and (b) shows a cross section taken along the line 11(b)—11(b) in FIG. 10.
Figure 12B:
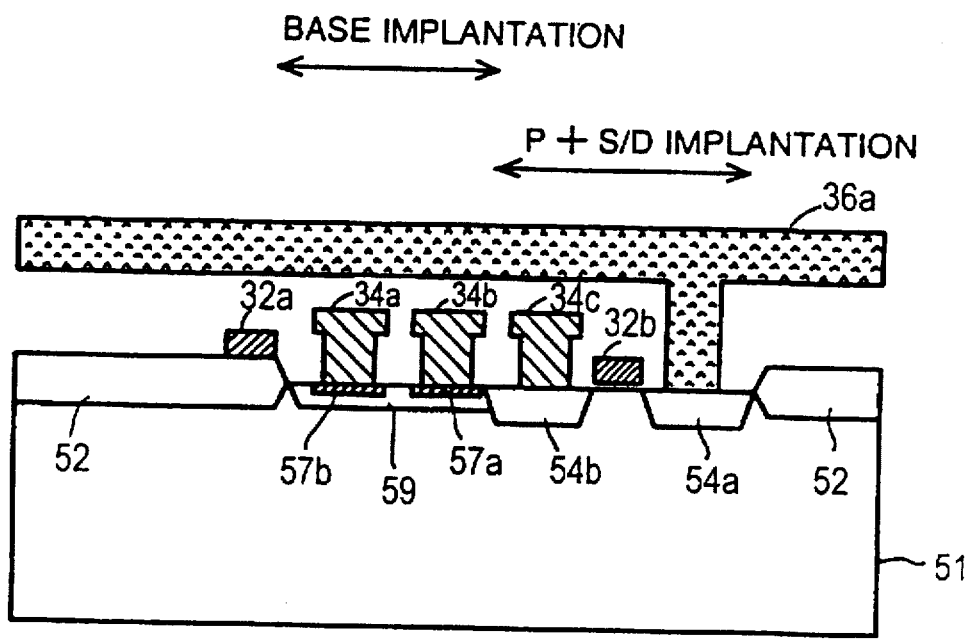

The cross section shown in FIG. 12(a) corresponds to the A–A' cross section in FIG. 5 and the cross section shown in FIG. 12(b) corresponds to the B–B' cross section in FIG. 5. In the third embodiment, the impurity concentration or the depth of the base region of the driving NPN bipolar transistor of lateral type is the same as that of the P$^+$ type source/drain regions of access transistors Q3 and Q4.

In the fourth embodiment, the step of implanting ions to P$^+$ type source/drain regions 54a and 54b of access transistors Q3 and Q4 are performed separately from that to base region 59 of the driving NPN bipolar transistor of lateral type.

Structured as such, junction depth and concentration of the base region of the bipolar transistor can be determined without an increase in area of the memory cell, thereby allowing optimization of parameters of the bipolar transistor.

For example, high impurity concentration is desired at the source/drain regions of access transistors Q3 and Q4, while high impurity concentration causes deterioration in implantation efficiency at the base region of the bipolar transistor. Thus, it is required to set the concentrations of these areas independently.

Fifth Embodiment

Figure 13:
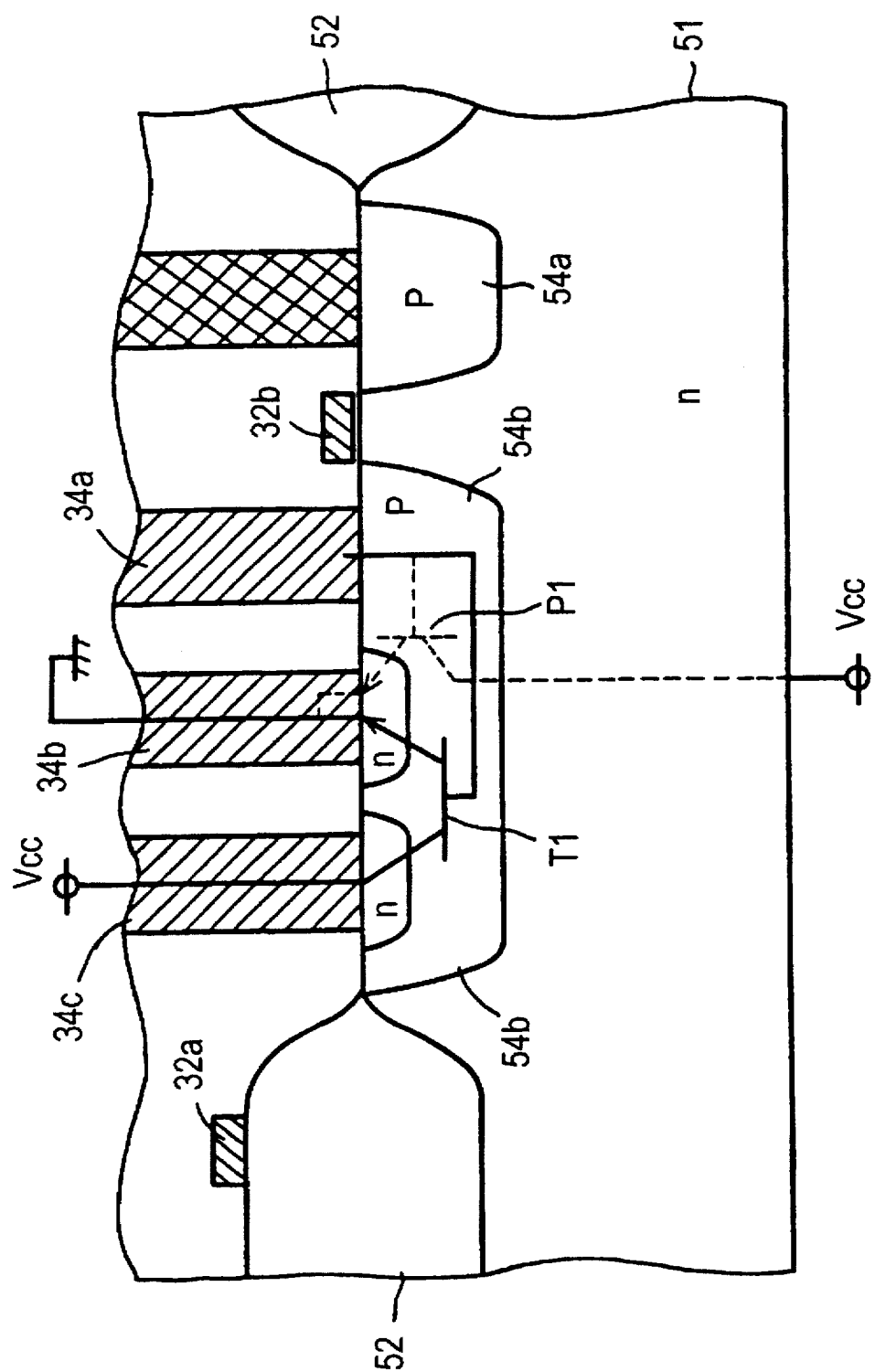
FIG. 13 is a cross sectional view showing a parasitic bipolar transistor in the second embodiment of the present invention.

Since a P type MOSFET is employed as an access transistor in the second through fourth embodiments, the silicon substrate under the base region of the bipolar transistor is of N type and the N type substrate is usually connected to power supply potential $V_{CC}$. FIG. 13 shows a cross sectional structure of the bipolar transistor portion according to the second embodiment. As described above, underlying the P type base region 54b of the bipolar transistor is the N type substrate which is connected to power supply potential $V_{CC}$. As a result, a parasitic bipolar transistor P1 is present in addition to the original lateral type bipolar transistor T1. More specifically, there exists a parasitic bipolar transistor which shares the emitter region and the base region with lateral type bipolar transistor T1 and has the N type substrate as the collector region.

For lateral type bipolar transistor T2 as well, a similar parasitic bipolar transistor P2 is present.

Figure 14:
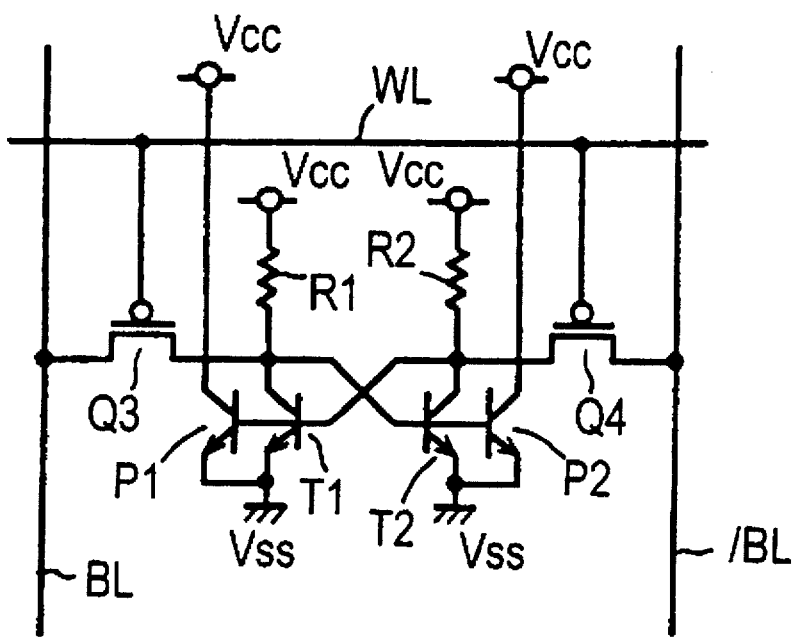
FIG. 14 is a circuit diagram showing an equivalent circuit including the parasitic bipolar transistor.

FIG. 14 is a circuit diagram showing an equivalent circuit of a memory cell including parasitic bipolar transistors P1 and P2.

Parasitic bipolar transistors P1 and P2 share the emitter and the base with lateral type bipolar transistors T1 and T2 respectively because of the structure, whereby the minority carriers introduced from the emitter to the base flow in great amount to the collectors of parasitic bipolar transistors P1 and P2. As a result, current amplification ratio ($h_{fe}$) of bipolar transistors T1 and T2 appears to be decreased, thereby causing deterioration in performance of lateral type bipolar transistors T1 and T2.

Figure 15:
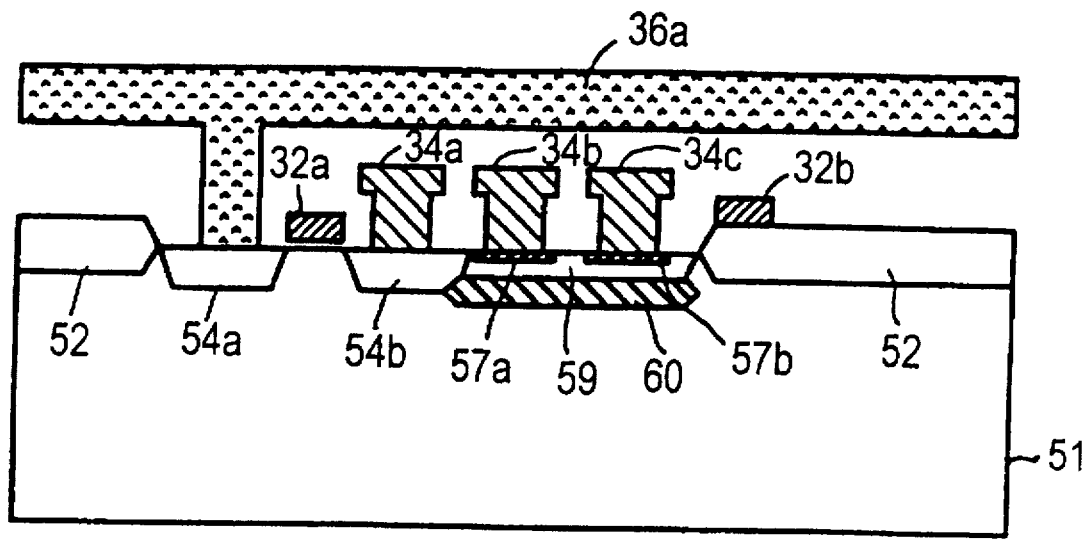
FIGS. 15 and 16 are cross sectional views showing structures of memory cells according to fifth and sixth embodiments of the present invention, respectively.

FIG. 15 shows a cross sectional structure of a memory cell in a static type semiconductor memory device according to a fifth embodiment of the present invention. It is different from the fourth embodiment shown in FIG. 12 in that a high concentration region 60 of the same conductivity type as the base region is formed in the semiconductor substrate under base region 59. Such high concentration layer can be formed by carrying out ion implantation for forming the base layer a plurality of times with different acceleration energies and different amounts of ions to be implanted.

By thus forming the high concentration layer, transport efficiency of parasitic bipolar transistors P1 and P2 are decreased, thereby solving the problems of deterioration in characteristics of lateral type bipolar transistors T1 and T2 due to operations of the parasitic bipolar transistor elements, as described above.

Sixth Embodiment

Figure 16:
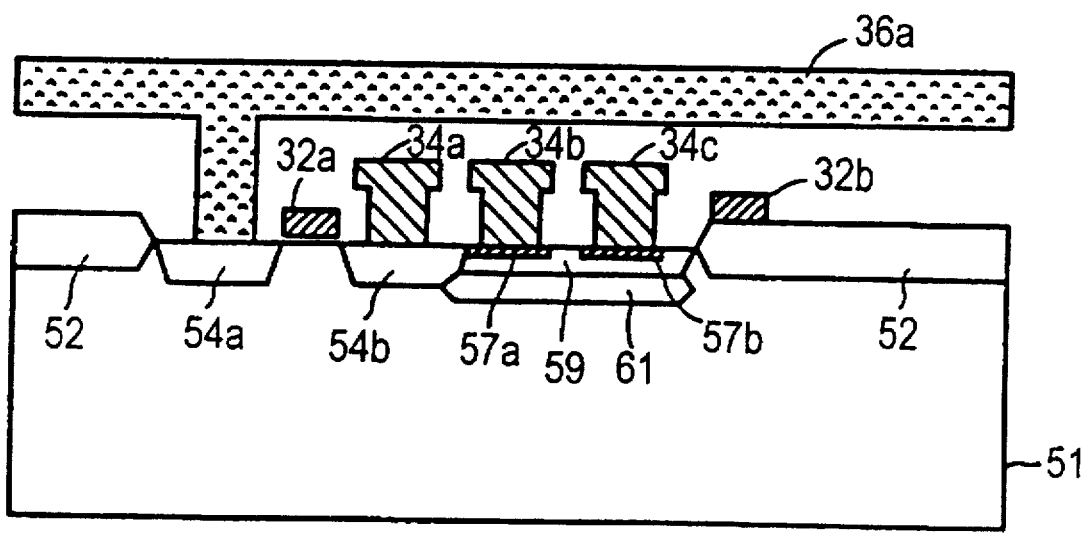

FIG. 16 shows a cross sectional structure of a memory cell in a static type semiconductor memory device according to the sixth embodiment of the present invention. It is different from the fifth embodiment in that the high concentration layer in the fifth embodiment is replaced with an insulating barrier layer 61. An example of such barrier layer is a buried oxide layer. The buried barrier layer of an oxide film can be formed by implanting ions of oxygen more deeply into the substrate for forming the base region as described in the fourth embodiment, followed by annealing.

Barrier layer 61 allows reduction in transport efficiency of the parasitic bipolar transistor as described in the fifth embodiment and allows to obtains the effects similar to the fifth embodiment.

Seventh Embodiment

Figure 17C:
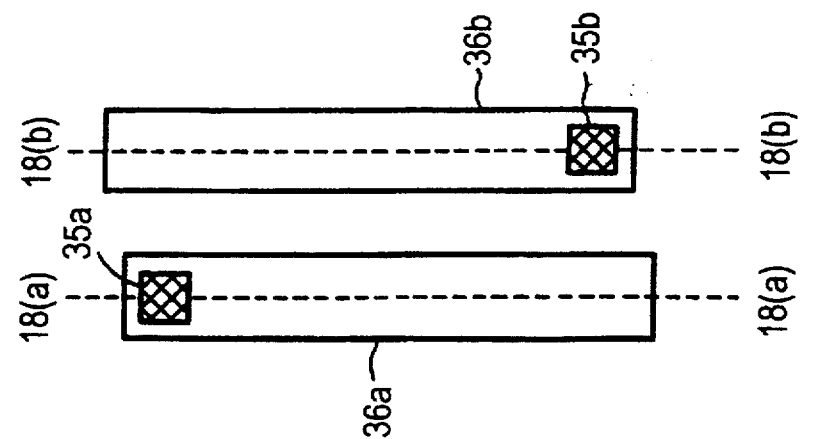
FIGS. 17a–17c are a plan view showing patterns of a memory cell according to a seventh embodiment of the present invention in which (a) to (c) show patterns of a bottom layer, an intermediate layer, and an upper layer, respectively.

FIG. 17 is a plan view showing patterns of a memory cell in a static type semiconductor memory device according to the seventh embodiment of the present invention.

The present embodiment is different from the second embodiment in that the elements forming the circuit shown in FIG. 1 is formed on a substrate having a thin film semiconductor layer on an insulator, i.e. an SOI (Silicon on Insulator) substrate. In addition, the cross-connection of the bases and collectors of driving bipolar transistors T1 and T2 are made by interconnections 34a and 34b formed in contact holes 33a and 33c in the interlayer insulating layer, which holes are open to collector region 40a or 40b of one transistor and base region 39c or 39b of the other transistor.

Figure 17B:
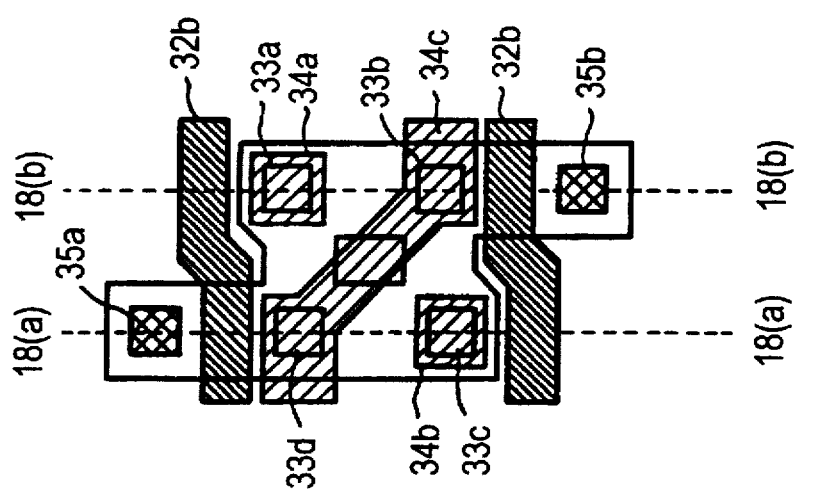
Figure 17A:
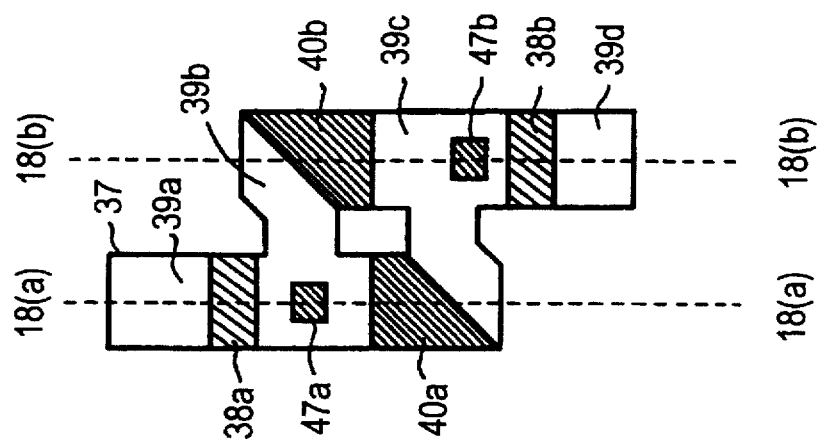

FIG. 17 shows a plurality of layers divided as illustrated in (a), (b) and (c). FIG. 17(a) shows an active region at the thin film silicon layer formed on the insulator. Regions 39a, 39b, 39c and 39d are P type regions, corresponding to the source/drain regions of access transistors Q3 and Q4 and base regions 39b and 39c of the lateral type bipolar transistors. Regions 40a and 40b are N type regions, corresponding to the collector regions of the lateral type bipolar transistors. Regions 47a and 47b are also N type regions, corresponding to the emitter regions of the lateral type bipolar transistors. Common region 39c shared by the base region and source/drain region is connected to collector region 40a at buried contact 33c portion. Similarly, common region 39b shared by the base region and the source/drain region is connected to collector region 40b at buried contact 33a portion. Regions 38a and 38b are the channel regions of access thin film MOSFETs Q3 and Q4, which are N type regions.

Regarding the patterns formed at a layer over those in FIG. 17(a), first polysilicon pattern 32 forms a word line as shown in FIG. 17(b). Interconnection patterns 34a and 34b are connected to the surface of the thin film semiconductor layer through buried contacts 33a and 33c. Interconnection patterns 34a and 34b connect base regions 39b and 39c of the lateral type bipolar transistors with collector regions 40b and 40a, respectively, as described above. Therefore, interconnection layer 34 is formed of polysilicon or metal and required to make an ohmic contact with the SOI surface at both P type and N type regions. Interconnection patterns 34a and 34b correspond to storage nodes A and B of the memory cell, and interconnection pattern 34c corresponds to a ground interconnection. Metal interconnections 36a and 36b form bit line pair BL and /BL. Metal interconnections 36a and 36b connect to the surface of thin film silicon layer 37 through contact holes 35a and 35b, respectively.

FIG. 18 is a cross sectional view in which (a) shows a cross section taken along the line A-A' in FIG. 17 and (b) shows a cross section taken along the line B-B' in FIG. 17. Referring to FIG. 18, the cross sectional structure of the seventh embodiment will be described below. On an insulator substrate 62, thin film semiconductor layer 37 is formed. Alternatively, if SIMOX (Separated by Implanted Oxygen) technology is employed, region 62 corresponds to the insulating layer formed near the surface of the silicon substrate. At thin film silicon layer 37, regions 39a-39d are of P type, and regions 38a, 38b, 40a, 40b, 47a and 47b are of N type.

Figure 18A:
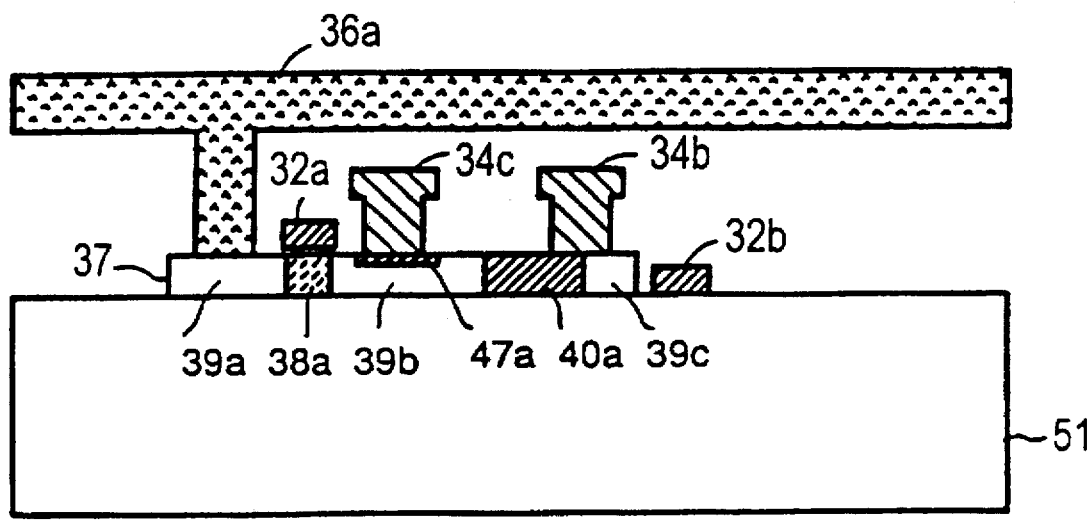
FIGS. 18a–18b are a cross sectional view showing cross sectional structures of the memory cell according to the seventh embodiment of the present invention in which (a) shows a cross section taken along the line 18(a)—18(a) in FIG. 17 and (b) shows a cross section taken along the line 18(b)—18(b) in FIG. 17.

First polysilicon layer 32a forms a gate electrode of the access transistor in the cross section shown in FIG. 18(a). Among interconnection layers 34a, 34b and 34c, especially layer 34b electrically connects P type silicon at base region 39c with N type silicon at collector region 40a.

Since collector region 40a extends from the surface of thin film semiconductor layer 37 to insulating region 62, one base region 39b and the other base region 39c of the driving lateral type bipolar transistors are separated by PN junction formed by N type region 40a and P type region 39c.

Figure 18B:
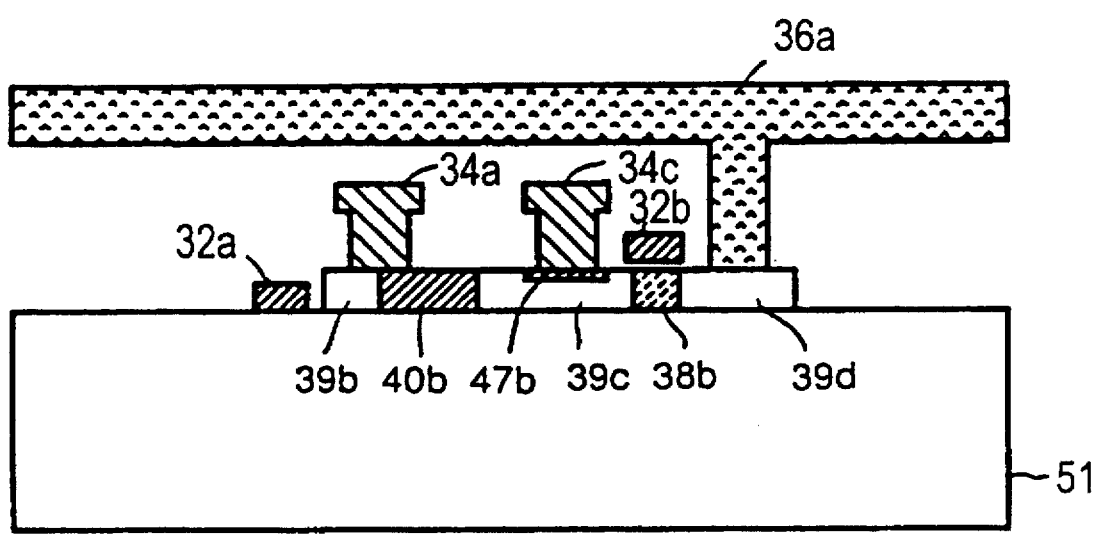
Figure 19:
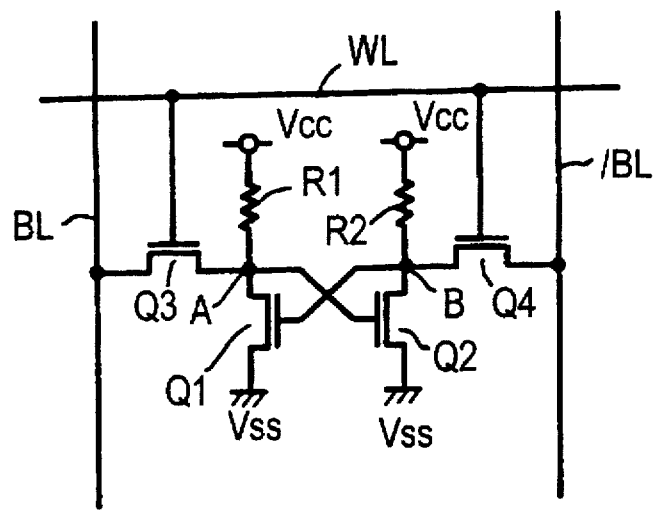
FIG. 19 is a circuit diagram showing an equivalent circuit of a highly resistive load type memory cell in a first conventional example.
Figure 20:
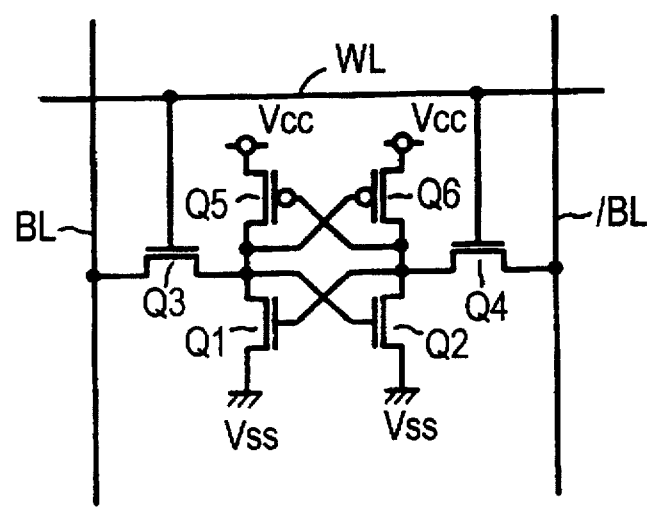
FIG. 20 is a circuit diagram showing an equivalent circuit of a CMOS load type memory cell in the first conventional example.
Figure 22:
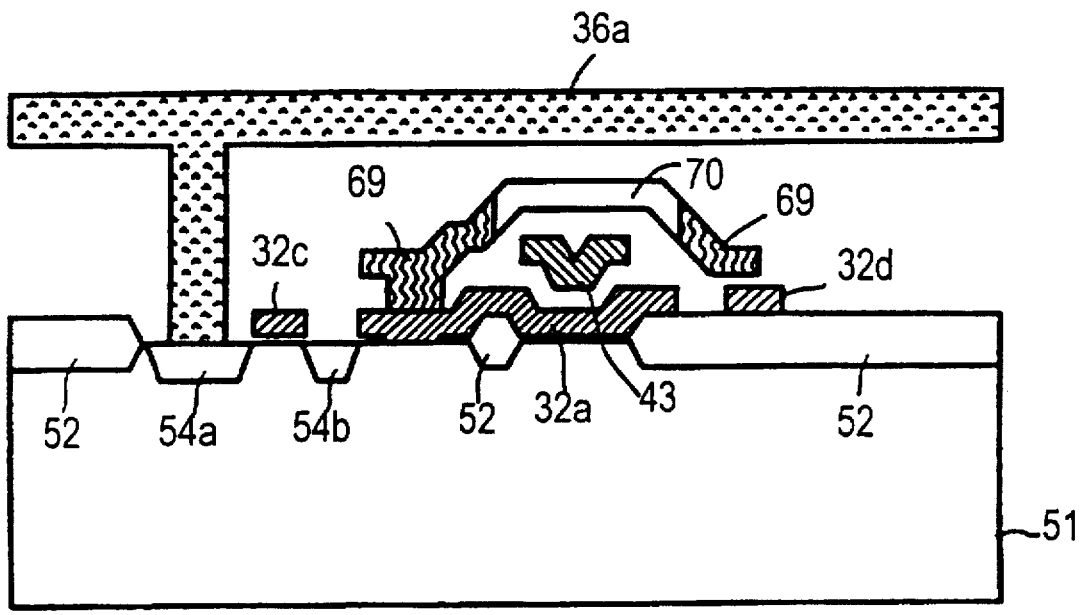
FIGS. 22a–22b are a cross sectional view showing cross sectional structures of the resistive load type memory cell according to the first conventional example in which (a) and (b) show cross sections taken along the lines 22(a)—22(a) and B—B' in FIG. 21, respectively.
Figure 22:
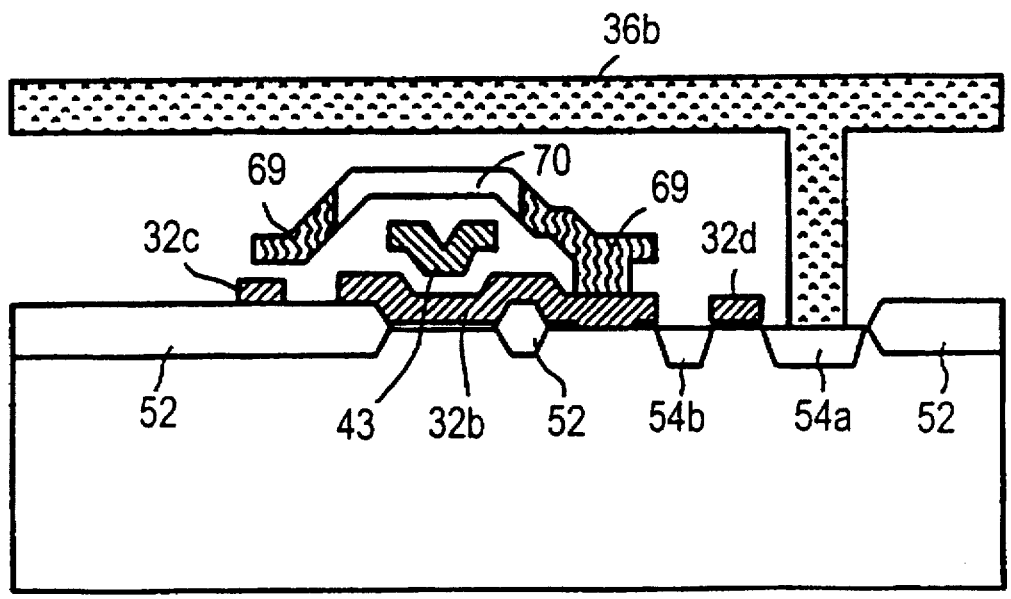
Figure 23A:
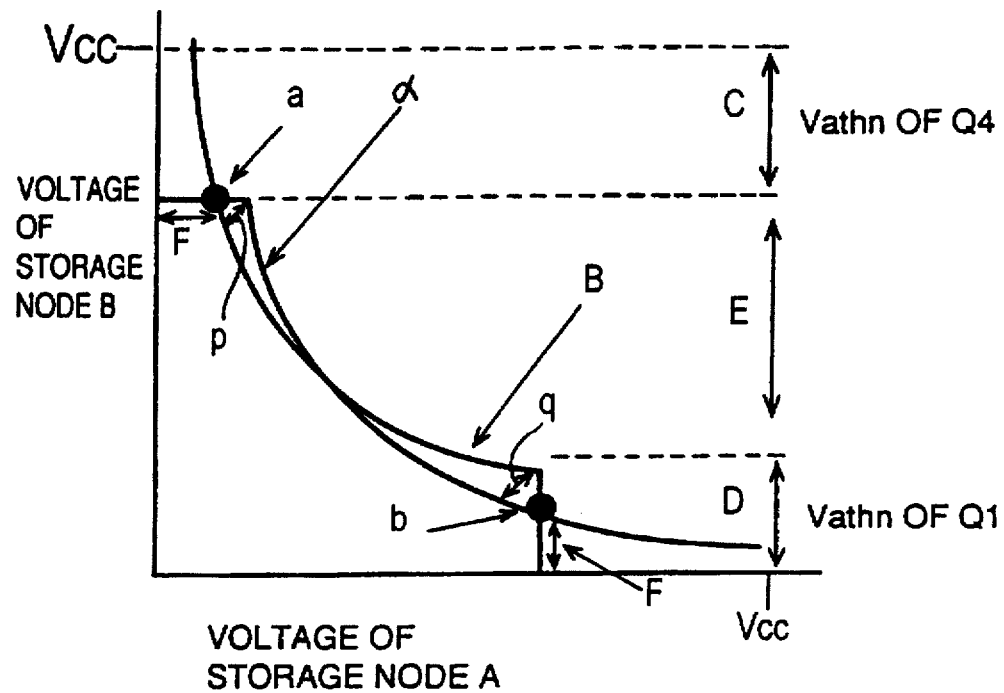
FIGS. 23(a)—23(b) illustrate operations, showing curves of data readout characteristics of a conventional memory cell and (b) shows an equivalent circuit upon readout.
Figure 23B:
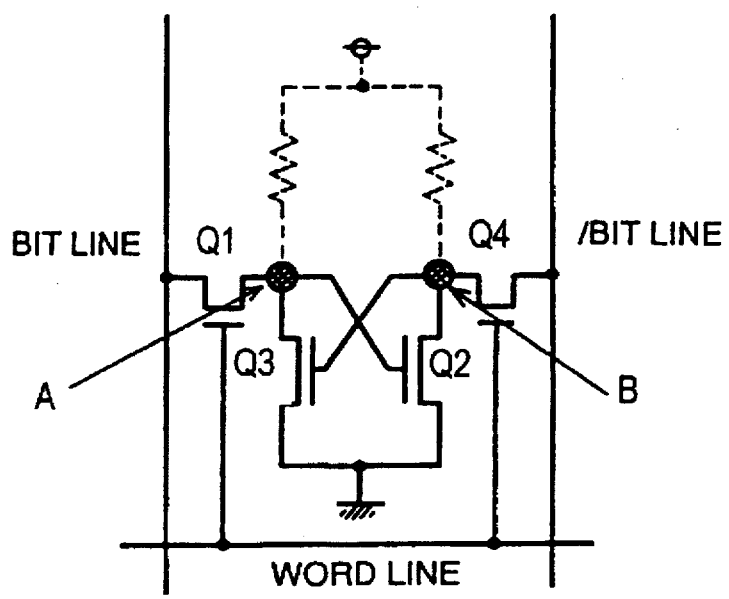
Figure 24:
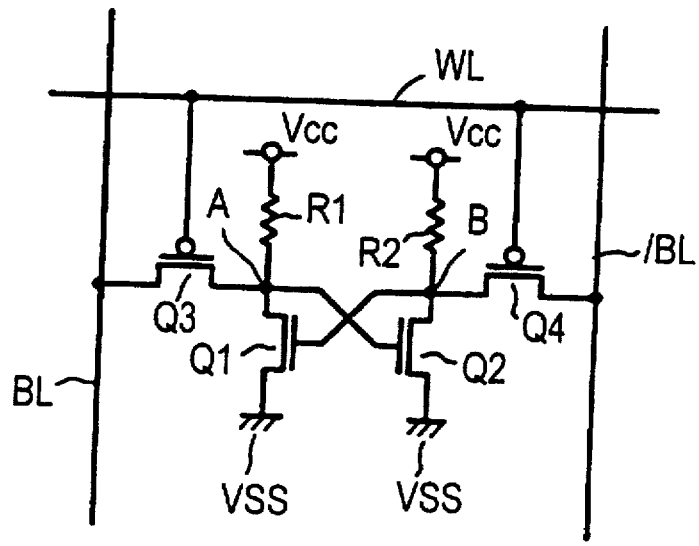
FIG. 24 is a circuit diagram showing an equivalent circuit of a second conventional example.

The structure shown in FIG. 18(b) is merely a mirror image of that in FIG. 18(a), and corresponding portions have the identical structures.

With the structure employing an SOI substrate as described above, four buried contacts 33 are included in a memory cell as shown in FIG. 17, fewer than six contacts included in the memory cell of the second embodiment shown in FIG. 5, thereby allowing reduction in area of the memory cell.

Moreover the current gain of the lateral type bipolar transistor is not deteriorated by such parasitic bipolar transistor as shown in FIG. 13.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static type semiconductor memory device including memory cells each having a flipflop circuit in which inputs and outputs of two inverters are coupled to each other, said device comprising:

a semiconductor substrate having a main surface;

a transistor group having multiple sets of a pair of access MOS transistors and a corresponding pair of driving bipolar transistors of a lateral type formed at said main surface of said semiconductor substrate;

an interlayer insulating layer covering a surface of said transistor group; and a pair of load elements formed on said interlayer insulating layer corresponding to each pair of said driving bipolar transistors of a lateral type; wherein each of said inverters includes said load element and said driving bipolar transistor of a lateral type;

said load element has one end connected to a first power supply and another end connected to a collector of said driving bipolar transistor of a lateral type, and said driving bipolar transistor of a lateral type has an emitter region and a collector region separately formed on said main surface of said semiconductor substrate;

a base region of said driving bipolar transistor of a lateral type is formed on said main surface of said semiconductor substrate and surrounds completely said emitter region and collector region except said main surface of said semiconductor substrate;

emitters of said driving bipolar transistor of a lateral type are connected to a second power supply;

collectors and bases of said pair of driving bipolar transistors of a lateral type are cross-connected to each other; and a base region of said driving bipolar transistor of a lateral type has a common region shared with one of source and drain regions of said access MOS transistor.

2. The static type semiconductor memory device according to claim 1, wherein said driving bipolar transistor of a lateral type has, in the semiconductor substrate under said base region, a buried high concentration layer of a same conductivity type as the base region, having an impurity concentration higher than that of the base region.

3. The static type semiconductor memory device according to claim 1, wherein said driving bipolar transistor of a lateral type has a non-conductive buried layer in the semiconductor substrate under said base region.

4. The static type semiconductor memory device according to claim 1, wherein said common region is different from said base region in terms of at least one of impurity concentration and depth.

5. A static type semiconductor memory device including memory cells each having a flipflop circuit in which inputs and outputs of two inverters are coupled to each other, said device comprising:

a semiconductor substrate having a main surface;

a transistor group having multiple sets of a pair of access MOS transistors and a corresponding pair of driving bipolar transistors of a lateral type formed at said main surface of said semiconductor substrate;

an interlayer insulating layer covering a surface of said transistor group; and a pair of load elements formed on said interlayer insulating layer corresponding to each pair of said driving bipolar transistors of a lateral type; wherein each of said inverters includes said load element and said driving bipolar transistor of a lateral type, said load element has one end connected to a first power supply and another end connected to a collector of said driving bipolar transistor of a lateral type, and said driving bipolar transistor of a lateral type has an emitter connected to a second power supply, collectors and bases of said pair of driving bipolar transistors of a lateral type are cross-connected to each other, a base region of said driving bipolar transistor of a lateral type has a common region shared with one of source and drain regions of said access MOS transistor, said common region is different from said base region in terms of at least one of impurity concentration and depth, and said driving bipolar transistor of a lateral type has, in the semiconductor substrate under the base region, a buried high concentration layer of a same conductivity type as the base region, having an impurity concentration higher than that of the base region.

6. A static type semiconductor memory device formed on an SOI substrate having a thin film semiconductor layer on an insulator as a main surface, and including memory cells each having a flipflop circuit having two inverters, said device comprising:

a transistor group having multiple sets of a pair of access thin film MOS transistors and a pair of driving bipolar transistors of a lateral type formed at said thin film semiconductor layer;

an interlayer insulating layer covering a surface of said transistor group; and a pair of load elements formed on said interlayer insulating layer corresponding to each pair of said driving bipolar transistors of a lateral type, and connected to said driving bipolar transistors of a lateral type through contact holes formed at said interlayer insulating layer; wherein each of said inverters includes said load element and said driving bipolar transistor of a lateral type;

said load element has one end connected to a first power supply and another end connected to a collector of said driving bipolar transistor of a lateral type, and said driving bipolar transistor of a lateral type has an emitter connected to a second power supply;

collectors and bases of said pair of driving bipolar transistors of a lateral type are cross-connected to each other;

a base region of said driving bipolar transistor of a lateral type has a common region shared with one of source and drain regions of said access thin film MOS transistor;

a collector region of said driving bipolar transistor of a lateral type is formed by a region of a same conductivity type extending from a surface of said thin film semiconductor layer to an interface with said insulator; and said contact hole is open to the collector region of one transistor and the base region of the other transistor of said pair of driving bipolar transistors of a lateral type.

* * * * *